US007956776B2

(12) United States Patent
Sakaguchi

(10) Patent No.: US 7,956,776 B2
(45) Date of Patent: Jun. 7, 2011

(54) ARITHMETIC DECODING APPARATUS

(75) Inventor: Hiroaki Sakaguchi, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 12/625,630

(22) Filed: Nov. 25, 2009

(65) Prior Publication Data

US 2010/0134330 A1 Jun. 3, 2010

(30) Foreign Application Priority Data

Nov. 28, 2008 (JP) ................................ P2008-303524

(51) Int. Cl.
*H03M 7/00* (2006.01)
(52) U.S. Cl. ........................................ 341/107; 341/106
(58) Field of Classification Search .................. 341/107, 341/106, 51, 141; 375/240.12, 240.25
See application file for complete search history.

(56) References Cited

U.S. PATENT DOCUMENTS 7,262,721 B2 * 8/2007 Jeon et al. ..................... 341/107

FOREIGN PATENT DOCUMENTS

JP           2007 74648        3/2007

* cited by examiner

*Primary Examiner* — Rexford N Barnie
*Assistant Examiner* — Joseph Lauture
(74) *Attorney, Agent, or Firm* — Frommer Lawrence & Haug LLP; William S. Frommer

(57) ABSTRACT

Disclosed herein is an arithmetic decoding apparatus including an instruction decoder configured to decode an arithmetically encoded data decoding instruction to be executed for carrying out an arithmetic-decoding process of arithmetically decoding arithmetically encoded data into a binary signal; an execution condition code holding section configured to hold the binary signal obtained as a result of an immediately preceding arithmetic-decoding process as an execution condition code; and an arithmetic decoding execution section configured to determine whether a context number specified by the arithmetically encoded data decoding instruction is to be used as a context index as it is or the specified context number incremented by 1 is to be used as the context index in accordance with the execution condition code, and carry out the arithmetic decoding process by making use of the determined context index.

5 Claims, 32 Drawing Sheets

FIG.3A context[mb_type_i]

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 3 | 4 | 5 | 6 | 7 | 8 | 9 | 10 | | | | | | | | |
| SE | Mb_Type_I | | | | | | | | | | | | | | | |

FIG.3B context[mb_type_p]

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 14 | 15 | 16 | 17 | 18 | 19 | 20 | 21 | 22 | 23 | | | | | | |
| SE | Mb_Type_P | | | | | | | SubMb_Type_P | | | | | | | | |

FIG.3C context[mb_type_b]

| cidx | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| ctxIdx | 27 | 28 | 29 | 30 | 31 | 32 | 33 | 34 | 35 | 36 | 37 | 38 | 39 | | | |
| SE | Mb_Type_B | | | | | | | | | SubMb_Type_B | | | | | | |

FIG. 4

| mb_type (I SLICE) | NAME | Bin DATA | | | | | | |
|---|---|---|---|---|---|---|---|---|
| | | 0 | 1 | 2 | 3 | 4 | 5 | 6 |
| 0 | I_4x4 | 0 | | | | | | |
| 1 | I_16x16_0_0_0 | 1 | 0 | 0 | 0 | 0 | 0 | |
| 2 | I_16x16_1_0_0 | 1 | 0 | 0 | 0 | 0 | 1 | |
| 3 | I_16x16_2_0_0 | 1 | 0 | 0 | 0 | 1 | 0 | |
| 4 | I_16x16_3_0_0 | 1 | 0 | 0 | 0 | 1 | 1 | |
| 5 | I_16x16_0_1_0 | 1 | 0 | 0 | 1 | 0 | 0 | 0 |
| 6 | I_16x16_1_1_0 | 1 | 0 | 0 | 1 | 0 | 0 | 1 |
| 7 | I_16x16_2_1_0 | 1 | 0 | 0 | 1 | 0 | 1 | 0 |
| 8 | I_16x16_3_1_0 | 1 | 0 | 0 | 1 | 0 | 1 | 1 |
| 9 | I_16x16_0_2_0 | 1 | 0 | 0 | 1 | 1 | 0 | 0 |
| 10 | I_16x16_1_2_0 | 1 | 0 | 0 | 1 | 1 | 0 | 1 |
| 11 | I_16x16_2_2_0 | 1 | 0 | 0 | 1 | 1 | 1 | 0 |
| 12 | I_16x16_3_2_0 | 1 | 0 | 0 | 1 | 1 | 1 | 1 |
| 13 | I_16x16_0_0_1 | 1 | 0 | 1 | 0 | 0 | 0 | |
| 14 | I_16x16_1_0_1 | 1 | 0 | 1 | 0 | 0 | 1 | |
| 15 | I_16x16_2_0_1 | 1 | 0 | 1 | 0 | 1 | 0 | |
| 16 | I_16x16_3_0_1 | 1 | 0 | 1 | 0 | 1 | 1 | |
| 17 | I_16x16_0_1_1 | 1 | 0 | 1 | 1 | 0 | 0 | 0 |
| 18 | I_16x16_1_1_1 | 1 | 0 | 1 | 1 | 0 | 0 | 1 |
| 19 | I_16x16_2_1_1 | 1 | 0 | 1 | 1 | 0 | 1 | 0 |
| 20 | I_16x16_3_1_1 | 1 | 0 | 1 | 1 | 0 | 1 | 1 |
| 21 | I_16x16_0_2_1 | 1 | 0 | 1 | 1 | 1 | 0 | 0 |
| 22 | I_16x16_1_2_1 | 1 | 0 | 1 | 1 | 1 | 0 | 1 |
| 23 | I_16x16_2_2_1 | 1 | 0 | 1 | 1 | 1 | 1 | 0 |
| 24 | I_16x16_3_2_1 | 1 | 0 | 1 | 1 | 1 | 1 | 1 |
| 25 | I_PCM | 1 | 1 | | | | | |

FIG.5

| mb_type (P SLICE) | NAME | Bin DATA ||||||| 
|---|---|---|---|---|---|---|---|---|
| | | 0 | 1 | 2 | 3 | 4 | 5 | 6 |
| 0 | P_L0_16x16 | 0 | 0 | 0 | | | | |
| 1 | P_L0_L0_16x8 | 0 | 1 | 1 | | | | |
| 2 | P_L0_L0_8x16 | 0 | 1 | 0 | | | | |
| 3 | P_8x8 | 0 | 0 | 1 | | | | |
| 4 | P_8x8ref0 | NONE |||||||
| 5 TO 30 | Intra,prefix only | 1 | | | | | | |

FIG. 6

| mb_type (B SLICE) | NAME | Bin DATA | | | | | | |
|---|---|---|---|---|---|---|---|---|
| | | 0 | 1 | 2 | 3 | 4 | 5 | 6 |
| 0 | B_Direct_16x16 | 0 | | | | | | |
| 1 | B_L0_16x16 | 1 | 0 | 0 | | | | |
| 2 | B_L1_16x16 | 1 | 0 | 1 | | | | |
| 3 | B_Bi_16x16 | 1 | 1 | 0 | 0 | 0 | 0 | |
| 4 | B_L0_L0_16x8 | 1 | 1 | 0 | 0 | 0 | 1 | |
| 5 | B_L0_L0_8x16 | 1 | 1 | 0 | 0 | 1 | 0 | |
| 6 | B_L1_L1_16x8 | 1 | 1 | 0 | 0 | 1 | 1 | |
| 7 | B_L1_L1_8x16 | 1 | 1 | 0 | 1 | 0 | 0 | |
| 8 | B_L0_L1_16x8 | 1 | 1 | 0 | 1 | 0 | 1 | |
| 9 | B_L0_L1_8x16 | 1 | 1 | 0 | 1 | 1 | 0 | |
| 10 | B_L1_L0_16x8 | 1 | 1 | 0 | 1 | 1 | 1 | |
| 11 | B_L1_L0_8x16 | 1 | 1 | 1 | 1 | 1 | 0 | |
| 12 | B_L0_Bi_16x8 | 1 | 1 | 1 | 0 | 0 | 0 | 0 |
| 13 | B_L0_Bi_8x16 | 1 | 1 | 1 | 0 | 0 | 0 | 1 |
| 14 | B_L1_Bi_16x8 | 1 | 1 | 1 | 0 | 0 | 1 | 0 |
| 15 | B_L1_Bi_8x16 | 1 | 1 | 1 | 0 | 0 | 1 | 1 |
| 16 | B_Bi_L0_16x8 | 1 | 1 | 1 | 0 | 1 | 0 | 0 |
| 17 | B_Bi_L0_8x16 | 1 | 1 | 1 | 0 | 1 | 0 | 1 |
| 18 | B_Bi_L1_16x8 | 1 | 1 | 1 | 0 | 1 | 1 | 0 |
| 19 | B_Bi_L1_8x16 | 1 | 1 | 1 | 0 | 1 | 1 | 1 |
| 20 | B_Bi_Bi_16x8 | 1 | 1 | 1 | 1 | 0 | 0 | 0 |
| 21 | B_Bi_Bi_8x16 | 1 | 1 | 1 | 1 | 0 | 0 | 1 |
| 22 | B_8x8 | 1 | 1 | 1 | 1 | 1 | 1 | |
| 23 TO 48 | Intra,prefix only | 1 | 1 | 1 | 1 | 0 | 1 | |

FIG.7

| sub_mb_type (P SLICE) | NAME | Bin DATA | | | | | |
|---|---|---|---|---|---|---|---|
| | | 0 | 1 | 2 | 3 | 4 | 5 |
| 0 | P_L0_8x8 | 1 | | | | | |
| 1 | P_L0_8x4 | 0 | 0 | | | | |
| 2 | P_L0_4x8 | 0 | 1 | 1 | | | |
| 3 | P_L0_4x4 | 0 | 1 | 0 | | | |

FIG.8

| sub_mb_type (B SLICE) | NAME | Bin DATA | | | | | |
|---|---|---|---|---|---|---|---|
| | | 0 | 1 | 2 | 3 | 4 | 5 |
| 0 | B_Direct_8x16 | 0 | | | | | |
| 1 | B_L0_8x8 | 1 | 0 | 0 | | | |
| 2 | B_L1_8x8 | 1 | 0 | 1 | | | |
| 3 | B_Bi_8x8 | 1 | 1 | 0 | 0 | 0 | |
| 4 | B_L0_8x4 | 1 | 1 | 0 | 0 | 1 | |
| 5 | B_L0_4x8 | 1 | 1 | 0 | 1 | 0 | |
| 6 | B_L1_8x4 | 1 | 1 | 0 | 1 | 1 | |
| 7 | B_L1_4x8 | 1 | 1 | 1 | 0 | 0 | 0 |
| 8 | B_Bi_8x4 | 1 | 1 | 1 | 0 | 0 | 1 |
| 9 | B_Bi_4x8 | 1 | 1 | 1 | 0 | 1 | 0 |
| 10 | B_L0_4x4 | 1 | 1 | 1 | 0 | 1 | 1 |
| 11 | B_L1_4x4 | 1 | 1 | 1 | 1 | 0 | |
| 12 | B_Bi_4x4 | 1 | 1 | 1 | 1 | 1 | |

FIG.11

| MNEMONIC | | NAME |
|---|---|---|
| cbc_dec_bin | cidx, rs [,CEX0/CEX1] [,CINC0/CINC1] [,CLR] | BIN DECODING INSTRUCTION |
| cbc_dec_bin_cc | cidx, rs, cc [,CEX0/CEX1] [,CINC0/CINC1] [,CLR] | BIN DECODING INSTRUCTION(CC) |
| cbc_dec_term_cc | cc | BIN DECODING INSTRUCTION(LAST) |
| cbc_match | cc, {ptn0, ptn1, ...} | BIN MATCHING INSTRUCTION |
| cbc_tblidx | rd, w | MULTI-VALUE CONVERSION TABLE INDEX INSTRUCTION |
| cbc_MbTypeI | rd | MULTI-VALUE CONVERSION INSTRUCTION(I) |
| cbc_MbTypeP | rd | MULTI-VALUE CONVERSION INSTRUCTION(P) |
| cbc_MbTypeB | rd | MULTI-VALUE CONVERSION INSTRUCTION(B) |
| cbc_SubMbTypeB | rd | MULTI-VALUE CONVERSION INSTRUCTION(SUB B) |
| cbc_SubMbTypeP | rd | MULTI-VALUE CONVERSION INSTRUCTION(SUB P) |
| cbc_ldq | cpr, addr | LOAD INSTRUCTION |
| cbc_stq | cpr, addr | STORE INSTRUCTION |
| br | cc==v, addr | CONDITIONAL BRANCH INSTRUCTION |
| jpr | addr | UNCONDITIONAL BRANCH INSTRUCTION |

FIG.16

```
1   L_MBTYPEI:  cbc_ldq           ctx, context[mb_type_i]
2               cbc_dec_bin_cc    0, gpr1, cc0, CLR
3               br                cc0==0, L_END
4               cbc_dec_term_cc   cc1
5               cbc_dec_bin       3, zero, CEX0
6               br                cc1==1, L_END
7               cbc_dec_bin       4, zero
8               cbc_dec_bin       5, zero, CEX1
9               cbc_dec_bin       6, zero
10              cbc_dec_bin       7, zero
11  L_END:      cbc_stq           ctx, context[mb_type_i]
12              cbc_MbTypeI       gpr2
13              jpr               return_address
```

FIG.20

```
1    L_MBTYPEP:  cbc_ldq         ctx, context[mb_type_p]
2                cbc_dec_bin_cc  0, zero, cc0, CLR
3                cbc_dec_bin     1, zero, CEX0
4                cbc_dec_bin_cc  2, zero, cc1, CINC1
5                br              cc0==0, L_END
6                br              cc1==0, L_END
7                cbc_dec_term_cc cc2
8                cbc_dec_bin     4, zero, CEX0
9                br              cc2==1, L_END
10               cbc_dec_bin     5, zero
11               cbc_dec_bin     5, zero, CEX1
12               cbc_dec_bin     6, zero
13               cbc_dec_bin     6, zero
14   L_END:      cbc_stq         ctx, context[mb_type_p]
15               cbc_MbTypeP     gpr2
16               jpr             return_address
```

FIG.25

```
1   L_MBTYPEB:  cbc_ldq          ctx, context[mb_type_b]
2               cbc_dec_bin_cc   0, gpr1, cc0, CLR
3               br               cc0==0, L_END
4               cbc_dec_bin_cc   3, zero, cc1
5               cbc_dec_bin      4, zero, CINCO
6               br               cc1==0, L_END
7               cbc_dec_bin      5, zero
8               cbc_dec_bin      5, zero
9               cbc_dec_bin      5, zero
10              cbc_match        cc2, {111x, 0xxx}
11              cbc_match        cc3, {1101}
12              br               cc2==1, L_END
13              cbc_dec_bin_cc   5, zero, cc4
14              br               cc3==0, L_END
15              br               cc4==0, L_END
16              cbc_dec_term_cc  cc5
17              cbc_dec_bin      6, zero, CEX0
18              br               cc5==1, L_END
19              cbc_dec_bin      7, zero
20              cbc_dec_bin      7, zero, CEX1
21              cbc_dec_bin      8, zero
22              cbc_dec_bin      8, zero
23  L_END:      cbc_stq          ctx, context[mb_type_p]
24              cbc_MbTypeB      gpr2
25              jpr              return_address
```

```
1    L_SUBMBTYPEP:  cbc_ldq          ctx, context[mb_type_p]
2                   cbc_dec_bin_cc   7, zero, cc0, CLR
3                   cbc_dec_bin      8, zero,CEX0
4                   br               cc0==1, L_END
5                   cbc_dec_bin      9, zero, CEX1
6    L_END:         cbc_stq          ctx, context[mb_type_p]
7                   cbc_subMbTypeP   gpr2
8                   jpr              return_address
```

FIG.32

| | | | |
|---|---|---|---|
| 1 | L_SUBMBTYPEB: | cbc_ldq | ctx, context[mb_type_b] |
| 2 | | cbc_dec_bin_cc | 9, zero, cc0, CLR |
| 3 | | cbc_dec_bin_cc | 10, zero, cc0, CEX1 |
| 4 | | cbc_dec_bin_cc | 11, zero, cc0, CEX1, CINC0 |
| 5 | | br | cc0==0, L_END |
| 6 | | cbc_dec_bin | 12, zero |
| 7 | | cbc_dec_bin | 12, zero |
| 8 | | cbc_dec_match | cc1, {x10x} |
| 9 | | br | cc1==0, L_END |
| 10 | | cbc_dec_bin | 12, zero |
| 11 | L_END: | cbc_stq | ctx, context[mb_type_b] |
| 12 | | cbc_SubMbTypeB | gpr2 |
| 13 | | jpr | return_address |

ARITHMETIC DECODING APPARATUS

BACKGROUND OF THE INVENTION

1. Field of the Invention

In general, the present invention relates to an arithmetic decoding method. More particularly, the present invention relates to an arithmetic decoding apparatus for decoding data which has been encoded by adoption of the CABAC (Context-Adaptive Binary Arithmetic Coding) technique.

2. Description of the Related Art

The CABAC technique is one of entropy coding techniques in the H.264 which has been standardized by the ITU-T (International Telecommunication Union-Telecommunication standardization sector). In accordance with the CABAC technique, prior to an encoding process, various kinds of multi-value data is converted into binary data by expressing the multi-value data in terms of '0' and '1' symbols. Then, the binary data is encoded by carrying out a binary arithmetic coding process. In a decoding process, on the other hand, a process is carried out in an opposite manner.

The binary data expressed in terms of '0' and '1' symbols is subjected to the binary arithmetic encoding process which is a process to replace {0, 1} with {LPS, MPS}. The MPS is an abbreviation for the Most Probable Symbol which is a symbol inferred to have a high appearance probability. On the other hand, the LPS is an abbreviation for the Least Probable Symbol which is a symbol other than the MPS.

Then, the binary data expressed in terms of two different symbols, i.e., MPSes and LPSes, is encoded by making use of arithmetic codes. The MPS is determined to be '0' or '1' by prediction for each symbol on the basis of already processed data. That is to say, in an encoding process, the MPS value of a symbol to be encoded next is determined only from data which has been obtained as a result of a previous encoding process. In a decoding process, on the other hand, the MPS value of a symbol to be decoded next is determined only from data which has been obtained as a result of a previous decoding process.

In addition, a binary arithmetic encoding process includes a process of always sequentially switching the probability model (also referred to hereafter as a context) to a context properly selected from a plurality of contexts prepared in advance as a proper context proper for the present state. In the case of CABAC decoding processing, context variables each corresponding to one of the contexts are stored in advance in a context-variable table. A context proper for the present state is selected from the contexts prepared in advance by identifying a context variable denoted by notation context [ctxIdx] from the context variables, which have been stored in advance in the context-variable table, by making use of a context index denoted by notation ctxIdx pointing to the context variable. Each of the contexts is configured to include a probability state index pStateIdx showing an appearance probability and valMPS showing a most probable symbol (MPS) having a high appearance probability. The probability state index pStateIdx of a context shows an inferred value of the appearance probability of the LPS in the context in terms of a probability state in the predefined range 0 to 63. On the other hand, valMPS indicates that a symbol corresponding to the MPS is either 0 or 1. It is to be noted that, for every context variable, a probability state index pStateIdx of the context corresponding to the context variable is denoted by notation context [ctxIdx].pStateIdx whereas valMPS of the context corresponding to the context variable is denoted by notation context [ctxIdx].valMPS.

In a CABAC decoder, one context variable is selected to serve as a base of a Bin decoding process carried out to generate a piece of Bin data. In the following description, a piece of Bin data is also referred to as a Bin-data bit which is 1 bit of binary data. Then, an updated value of the context index used for identifying a context variable is calculated by making use of the Bin data generated as a result of the execution of a Bin decoding process. In the CABAC decoder, a decoding method is defined for each of parameters composing a macroblock. The parameter is referred to as an SE (syntax element). In CABAC decoding processing to produce Bin data for a syntax element, a plurality of context variables are used in order to generate a plurality of Bin-data bits. Then, for the Bin-data bits, multi-value data of the syntax element is found in accordance with a multi-value conversion method which is determined uniquely for the syntax element.

In a Bin decoding process of generating one Bin-data bit, in a number of cases, context indexes each determined in accordance with the value of the immediately preceding Bin-data bit as an index for identifying a context variable used in a Bin decoding process exist at the beginning of the syntax element and in the middle of the syntax element in an ascending order. In addition, in many cases, the length of the Bin data obtained as a result of a Bin decoding process to generate the Bin data for a syntax element is indeterminate till the immediately preceding Bin data is obtained as a result of a Bin decoding process. It is to be noted that the length of the Bin data is the number of Bin-data bits each obtained as a result of a Bin decoding process. Thus, in a Bin decoding process of generating Bin data for a syntax element after the end of a Bin decoding process of generating Bin data for another syntax element, each context index is not determined till a Bin decoding process of generating the immediately preceding Bin data for a syntax element is completed. In addition, in a Bin decoding process of generating Bin data for a syntax element, there are a case in which the same context variable identified by the same context index is used consecutively in different decoding processes for generating different Bin-data bits for the syntax element and a case in which different context variables identified by different context indexes are used in different decoding processes of generating different Bin-data bits for the syntax element.

There is a case in which the context index identifying a context variable for generating a Bin-data bit at the head of Bin data is a number determined in accordance with the syntax element obtained from the Bin data. However, there is also a case in which the context index identifying a context variable for a Bin-data bit at the head of Bit data is a number determined in accordance with a syntax element which is selected from approximately four candidates in accordance with what values are the values of a plurality of syntax elements each already obtained from Bin data generated in previous decoding processes. The context index identifying a context variable for a Bin-data bit other than the Bin-data bit at the head of the syntax element is computed in accordance with whether the immediately preceding Bin-data bit obtained as a result of a Bin decoding process carried out by execution of the immediately preceding Bin decoding instruction is 0 or 1. In addition, the CABAC decoder determines whether or not the end of a syntax element has been obtained as a result of CABAC decoding processing by referring to a variable-length code table defined for the syntax element.

The CABAC decoding procedure includes a number of branch processes each implemented by a branch instruction of a program implementing the CABAC decoding procedure. In addition, the context index used for identifying a context variable is not always incremented by one for every decoding process. For example, it is possible to provide a configuration in which the same context index for identifying a context variable is used successively in all the Bin decoding processes or the context index may be incremented by two for every Bin decoding process. At any rate, the context index is calculated in accordance with the value of the immediately preceding Bin-data bit obtained as a result of a Bin decoding process carried out by execution of the immediately preceding Bin decoding instruction as described above and the process of calculating the context index is not simple. In addition, the length of Bin data obtained as a result of CABAC decoding processing to generate the Bin data for a syntax element is not a fixed value determined by the syntax element. Instead, the length of Bin data obtained as a result of CABAC decoding processing to generate the Bin data for a syntax element varies in accordance with the decoding-process path which may or may not include branch processes as described above. Thus, the process carried out by the CABAC decoder to determine whether or not the end of a syntax element has been generated as a result of a Bin decoding process is also complicated as well.

There is a case in which the context index identifying a context variable for the Bin-data bit at the head of Bit data is a number determined uniquely in accordance with the syntax element which is obtained as an eventual result of CABAC decoding processing to generate Bit data for the syntax element. On the other hand, there is also a case in which the context index identifying a context variable for the Bin-data bit at the head of Bit data is a number determined uniquely from adjacent macroblocks which are each composed of syntax elements. If the context index identifying a context variable for the Bin-data bit at the head of Bit data is a number determined uniquely from adjacent macroblocks, syntax elements pertaining to the adjacent macroblock right above the present syntax element and syntax elements pertaining to the adjacent macroblock on the left side of the present syntax element are referenced. Image portions such as the upper edge of the image and the right and left edges of the image may not have adjacent macroblocks in some cases. In such cases, an exception process also needs to be carried out as well. As a result, the Bin decoding process becomes extremely complicated.

In order to carry out the CABAC decoding processing by making use of hardware, it is necessary to provide a dedicated memory to be used for storing 460 context variables and a dedicated memory to be used for holding preceding syntax elements to be used for computing a context index identifying a context variable for the Bin-data bit at the head of Bit data. In addition, it is also necessary to provide state machines according to individual decoding methods which each correspond to a syntax element. Thus, the CABAC decoder raises problems that extremely complex control needs to be executed and the circuit size undesirably becomes large.

On the other hand, it is also possible to carry out the CABAC decoding processing by making use of software executed on a hardware combination assumed to include the CPU and a coprocessor. When a coprocessor instruction for giving one context index is executed, a Bin decoding process is carried out in order to generate a Bin-data bit and it can be assumed that an instruction is executed in order to store the Bin-data bit in a register which is employed in the CPU. As an apparatus for executing such an instruction, there has been proposed a CABAC decoder which pipelines the Bin decoding processes to generate Bin data in order to be capable of operating at about the same high frequency as the CPU. For details of the proposed CABAC decoder, the reader is suggested to refer to Japanese Patent Laid-open No. 2007-074648 which includes a table shown in FIG. 6.

SUMMARY OF THE INVENTION

In accordance with the existing technology for carrying out a decoding process of generating Bin data by execution of software, the Bin decoding process is pipelined. In consequence, several pipelined processing cycles are desired in order to obtain the Bin data as a result of the Bin decoding process. Thus, the next context index is determined not in due time. If the CPU executes software to calculate a context index and determine the end of the syntax element, a comparison instruction and a branch instruction are desired for each decoding process of generating Bin data. Thus, the determination of a context index is further delayed. As a result, the Bin decoding process of generating the next Bin data may not be started so that a pipeline stall occurs frequently. Accordingly, it is feared that the efficiency of the instruction execution deteriorates considerably. In general, in order to conceal the latency of an instruction, there is provided a programming technique to insert a processing instruction, which is not dependent on a result produced by a previous instruction, into an instruction position lagging behind an instruction having a long latency. In the CABAC decoding processing, however, there are almost no such processing patterns including an instruction not dependent on a result produced by a previous instruction so that it is difficult to properly hide the latency of the previous instruction.

Addressing the problems described above, inventors of the present invention have innovated an instruction set that is proper for context-adaptive binary arithmetic decoding processes.

In order to solve the problems described above, in accordance with a first mode of the present invention, there is provided an arithmetic decoding apparatus employing: an instruction decoder configured to decode an arithmetically encoded data decoding instruction to be executed for carrying out an arithmetic-decoding process of arithmetically decoding arithmetically encoded data into a binary signal; an execution condition code holding section configured to hold the binary signal obtained as a result of an immediately preceding arithmetic-decoding process as an execution condition code; and an arithmetic decoding execution section configured to determine whether a context number specified by the arithmetically encoded data decoding instruction is to be used as a context index as it is or the specified context number incremented by 1 is to be used as the context index in accordance with the execution condition code; and carry out the arithmetic decoding process by making use of the determined context index.

Thus, it is possible to bring about an effect of a Bin decoding process which is carried out by selecting a context index in accordance with a binary signal obtained as a result of an immediately preceding arithmetic-decoding process.

In addition, in accordance with the first mode of the present invention, it is also possible to provide a configuration in which the arithmetic decoding execution section determines whether or not the arithmetic-decoding process is to be carried out on the basis of the execution condition code. Thus, it is possible to bring about an effect of a capability of controlling the execution of the arithmetic-decoding process in accordance with a binary signal obtained as a result of an immediately preceding arithmetic-decoding process.

On top of that, in accordance with the first mode of the present invention, it is also possible to provide a configuration in which the context number is specified in the arithmetically encoded data decoding instruction as an immediate value to be added to the contents of a register indicated by an input operand also specified in the arithmetic-encoded data decoding instruction. Thus, it is possible to bring about an effect of a capability of setting the context number dynamically.

In addition, in accordance with a second mode of the present invention, there is provided an arithmetic decoding apparatus employing: an instruction decoder configured to decode an arithmetically encoded data decoding instruction for carrying out an arithmetic-decoding process of arithmetically decoding arithmetically encoded data into a binary signal; a matching instruction having a bit map, which represents a matching condition of the arithmetic-decoding process, as an input operand; and a branch instruction for making an instruction jump in accordance with a branch condition code; an arithmetic-decoding execution section configured to carry out the arithmetic-decoding process by making use of a context number specified by the arithmetically encoded data decoding instruction; a history holding section configured to be used to store a history of the binary signals each obtained as a result of the arithmetic-decoding process; a matching process section configured to set the branch condition code in accordance with whether or not the history of the binary signal matches the matching condition; and an instruction control section configured to make the instruction jump in accordance with the branch condition code.

In addition, in accordance with the second mode of the present invention, it is also possible to provide a configuration in which, if an input operand of the arithmetically encoded data decoding instruction specifies an operation to clear the history, the arithmetic-decoding execution section clears the history held by the history holding section. It is thus possible to bring about an effect of clearing the history prior to the start of a Bin decoding process to generate Bin data for a syntax element.

In accordance with the embodiment of the present invention, in the context-adaptive binary arithmetic decoding process carried out by execution of software, it is possible to give an excellent effect of the capability of increasing the speed of the process.

BRIEF DESCRIPTION OF THE DRAWINGS

FIGS. 3A to 3C are a plurality of diagrams each showing typical assignment of context indexes each identifying a context variable to SEs (syntax elements) for macroblock-type context groups in the embodiment;

FIG. 4 is a variable-length code table showing relations between a syntax element of Mb_Type_I which is mb_type of the I slice and Bin data;

FIG. 5 is a variable-length code table showing relations between a syntax element of Mb_Type_P which is mb_type of the P slice and Bin data;

FIG. 6 is a variable-length code table showing relations between a syntax element of Mb_Type_B which is mb_type of the B slice and Bin data;

FIG. 7 is a variable-length code table showing relations between a syntax element of SubMb_Type_P which is sub_mb_type of the P slice and Bin data;

FIG. 8 is a variable-length code table showing relations between a syntax element of SubMb_Type_B which is sub_mb_type of the B slice and Bin data;

FIG. 11 is a table showing a typical instruction set for the CABAC decoding processing according to the embodiment of the present invention;

FIG. 16 shows a typical program composed of instructions pertaining to an instruction set according to the embodiment of the present invention to serve as a program to be executed for carrying out CABAC decoding processing to generate a syntax element of an I-slice macroblock type;

FIG. 20 shows a typical program composed of instructions pertaining to an instruction set according to the embodiment of the present invention to serve as a program to be executed for carrying out CABAC decoding processing to generate a syntax element of a P-slice macroblock type;

FIG. 25 shows a typical program composed of instructions pertaining to an instruction set according to the embodiment of the present invention to serve as a program to be executed for carrying out CABAC decoding processing to generate a syntax element of a B-slice macroblock type;

FIG. 32 shows a typical program composed of instructions pertaining to an instruction set according to the embodiment of the present invention to serve as a program to be executed for carrying out CABAC decoding processing to generate a syntax element of a B-slice sub-macroblock type.

DETAILED DESCRIPTION OF THE PREFERRED EMBODIMENT

Figure 1:
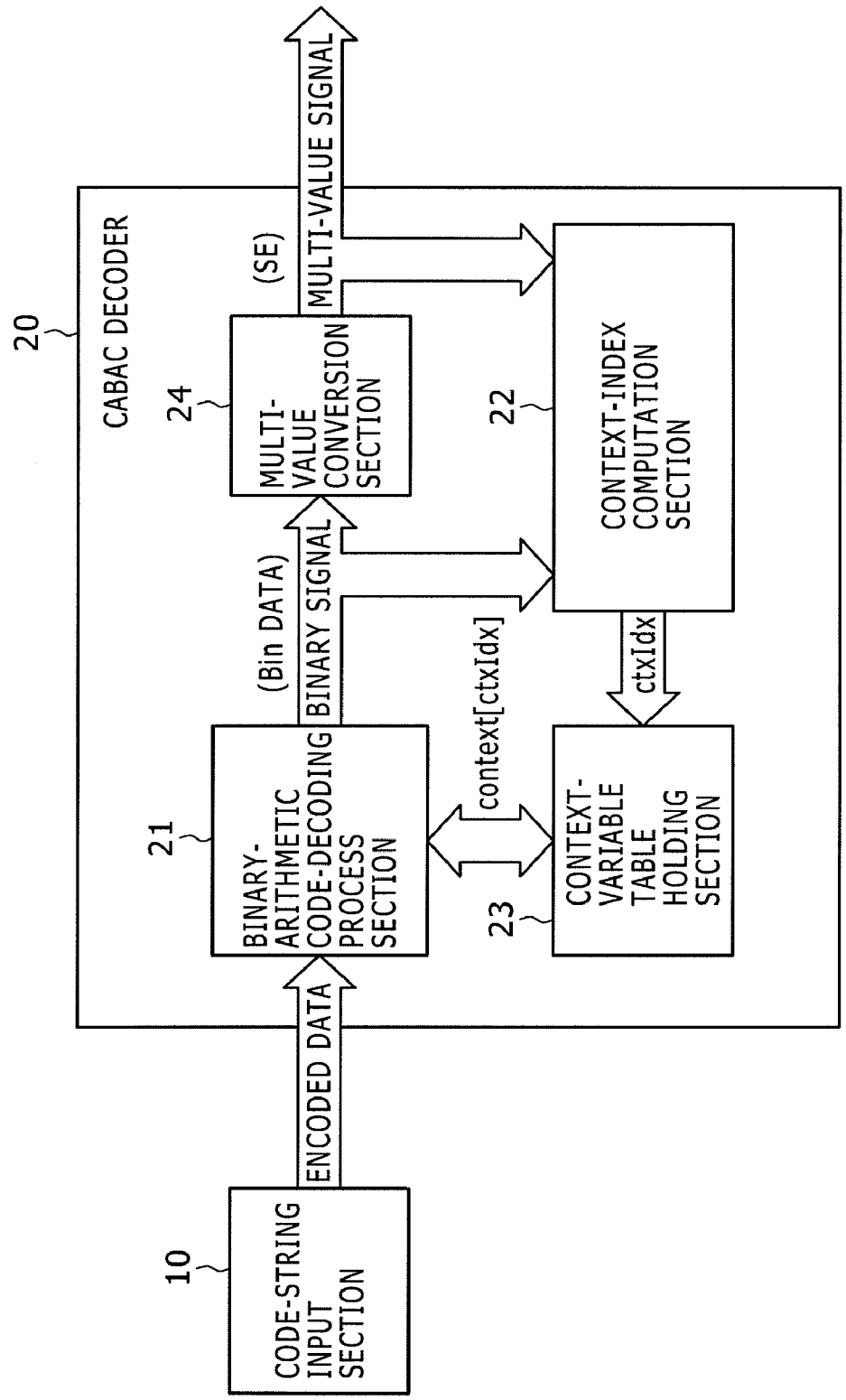
FIG. 1 is a block diagram showing a typical functional configuration of a CABAC decoder which serves as a typical example of an arithmetic decoding apparatus according to an embodiment of the present invention.

A preferred embodiment implementing the present invention is explained below. In the following description, the preferred embodiment is referred to simply as an embodiment. The embodiment is described in chapters which are arranged as follows.
1: Outline of a CABAC Decoder
2: Coprocessor Instructions
3: Typical Applications
1: Outline of a CABAC Decoder
Typical Configuration of the CABAC Decoder FIG. 1 is a block diagram showing a typical functional configuration of a CABAC decoder 20 which serves as a typical example of an arithmetic decoding apparatus according to an embodiment of the present invention. As shown in the figure, the CABAC decoder 20 for carrying out CABAC decoding processing employs a binary-arithmetic code-decoding process section 21 for receiving encoded data from a code-string input section 10 and carrying out a Bin (binary) decoding process of decoding the encoded data into binary data as well as a multi-value conversion section 24 for carrying out a multi-value conversion process on the binary data in order to convert the binary data into a multi-value signal. In the figure, the binary data is denoted by notation Bin data whereas the multi-value signal is denoted by notation SE which stands for a syntax element. The syntax element is information which prescribes transmission by making use of a syntax in the H.264. As shown in the figure, in addition to the binary-arithmetic code-decoding process section 21 and the multi-value conversion section 24, the CABAC decoder 20 also employs a context-index computation section 22 and a context-variable table holding section 23.

The context-index computation section 22 is a section for computing a context index ctxIdx and supplying the context index to the binary-arithmetic code-decoding process section 21. When the context-index computation section 22 computes a context index, the context-index computation section 22 refers to Bin data obtained as a result of the Bin decoding process carried out by the binary-arithmetic code-decoding process section 21 and the syntax element output by the multi-value conversion section 24.

The context-variable table holding section 23 is a section for holding context variables each corresponding to a context in a context-variable table. Every context variable has a probability state index pStateIdx showing an appearance probability and valMPS showing a most probable symbol (MPS) having a high appearance probability. Every context variable held in the context-variable table holding section 23 is identified by a context index ctxIdx and expressed as context (ctxIdx).

The binary-arithmetic code-decoding process section 21 receives encoded data supplied by a code-string input section 10 and carries out a Bin (binary) decoding process of decoding the encoded data into binary data. When the binary-arithmetic code-decoding process section 21 decodes one symbol, the binary-arithmetic code-decoding process section 21 gets a context index ctxIdx from the context-index computation section 22 and then acquires a context variable context [ctxIdx] identified by the context index ctxIdx from the context-variable table holding section 23. Subsequently, the binary-arithmetic code-decoding process section 21 decodes a symbol of the encoded data on the basis of the context variable context (ctxIdx) and supplies Bin data obtained as a result of the Bin decoding process to the multi-value conversion section 24.

The multi-value conversion section 24 carries out a multi-value conversion process on the Bin (binary) data output by the binary-arithmetic code-decoding process section 21 in order to convert the binary data into the original multi-value signal referred to as a syntax element. A binary arithmetic encoding process carried out by an encoder is a process of converting the original multi-value signal into a binary signal represented by the Bin (binary) data in accordance with the syntax element. The multi-value conversion process carried out by the multi-value conversion section 24 is the reversed process of the binary arithmetic encoding process carried out by the encoder. As described above, the multi-value conversion process is carried out by the multi-value conversion section 24 to convert the Bin data representing the binary signal back into the original multi-value signal referred to as the syntax element.

Figure 2:
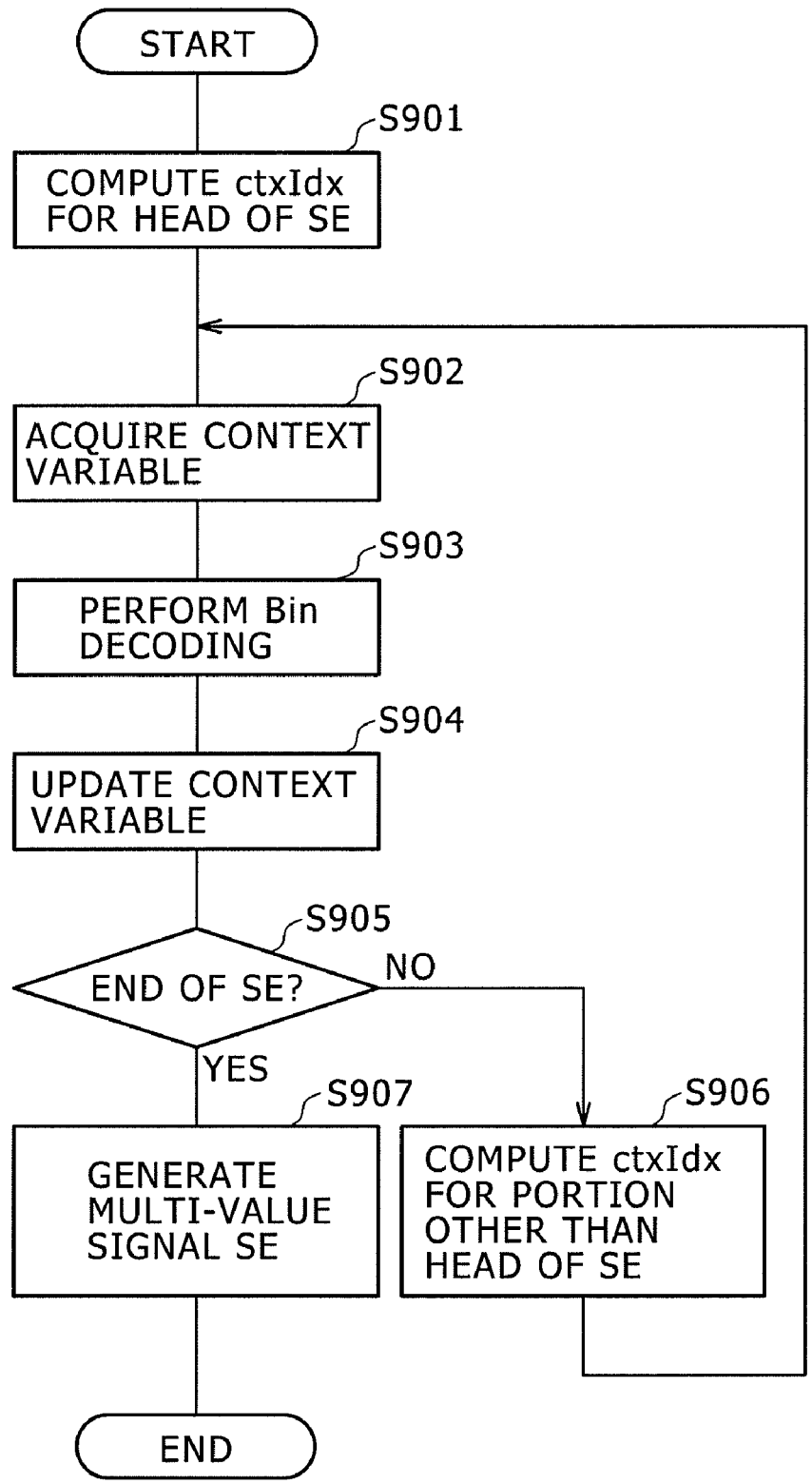
FIG. 2 shows a flowchart representing a typical procedure of CABAC decoding processing according to the embodiment of the present invention.

FIG. 2 shows a flowchart representing a typical procedure of the CABAC decoding processing according to the embodiment of the present invention. The CABAC decoding processing is divided into two large processing portions. The first large processing portion is Bin (binary) decoding processing carried out by making use of the context variable at steps S902 to 5904 to produce Bin data whereas the second large processing portion is multi-value conversion processing carried out at steps S901 and 5905 to 5907 to convert the Bin data into the original multi-value signal. In particular, a process carried out at the step S903 is referred to as the Bin decoding process described earlier whereas a process carried out at the step S907 is referred to as the multi-value conversion process explained above.

As shown in the figure, the flowchart begins with the step S901 at which the context-index computation section 22 computes the context index ctxIdx for the Bin-data bit at the beginning of Bin data for a syntax element. In some cases, the context index ctxIdx for the Bin-data bit at the beginning of Bin data for the syntax element is a number determined in accordance with the syntax element to be eventually produced in the CABAC decoding processing including the Bin decoding process for generating the Bin data. In other cases, the context index ctxIdx for the Bin-data bit at the beginning of Bin data is a number determined in accordance with a syntax element which is selected from approximately four candidates in accordance with what values are the values of a plurality of syntax elements already produced from the previous CABAC decoding processing.

Then, at the next step S902, the binary-arithmetic code-decoding process section 21 gets the context index ctxIdx from the context-index computation section 22 and acquires a context variable context [ctxIdx] identified by the context index ctxIdx from the context-variable table holding section 23.

Subsequently, at the next step S903, the binary-arithmetic code-decoding process section 21 makes use of the context variable acquired from the context-variable table holding section 23 to carry out a Bin decoding process of decoding the encoded data received from the code-string input section 10 into Bin data. Then, at the next step S904, an updated value of the context index used for identifying the context variable held by the context-variable table holding section 23 is calculated by making use of the Bin data obtained as a result of the Bin decoding process.

Subsequently, at the next step S905, the multi-value conversion section 24 refers to a variable-length code table to be described later in order to produce a result of determination as to whether or not Bin data for the end of a syntax element has been obtained as a result of the CABAC decoding processing. If the result of the determination does not indicate that the end of a syntax element has been obtained as a result of the CABAC decoding processing, the flow of the processing goes on to a step S906 at which the context-index computation section 22 computes the next context index ctxIdx. Then, the flow of the processing goes back to the step S902 to repeat the processes carried out at the step S902 and the subsequent steps. In the case of Bin data for a syntax-element portion other than the start of a syntax element, at the step S906, the context-index computation section 22 computes a context index ctxIdx in accordance with whether the Bin data obtained as a result of the Bin decoding process carried out by execution of the immediately preceding Bin decoding instruction is 0 or 1. If the determination result produced at the step S905 indicates that the end of a syntax element has been obtained as a result of the CABAC decoding processing, on the other hand, the flow of the processing goes on to a step S907 at which the multi-value conversion section 24 generates the syntax element as a multi-value signal.

Outline of CABAC Decoding

As described above, the binary-arithmetic code-decoding process section 21 carries out a Bin decoding process as a part of the CABAC decoding processing by making use of a context variable context [ctxIdx] obtained from the context-variable table holding section 23 as a context variable identified by the context index ctxIdx generated by the context-index computation section 22. The following description explains relations among the context index, the Bin data and the syntax element by taking MB (macroblock)-type context groups as examples.

FIGS. 3A to 3C are a plurality of diagrams each showing typical assignment of context indexes each identifying a context variable to SEs (syntax elements) for macroblock-type context groups in the embodiment. Reference notation cidx denotes a context index relative to the start of the syntax element in the assignment. Numbers 0, 1, 2 and so on are the values of the relative context index cidx. On the other hand, reference notation ctxIdx denotes a context index prescribed in the H.264. Numbers 3, 4, 5 and so on which are shown in the diagram of FIG. 3A are the values of context variables each identified by a context index ctxIdx.

To be more specific, FIG. 3A is a diagram showing typical assignment of context indexes each identifying a context variable context [mb_type_i] for an I slice to a syntax element Mb_type_I. As shown in the figure, eight context variables of 3 to 10 are assigned to a syntax element Mb_type_I.

FIG. 3B is a diagram showing typical assignment of context indexes each identifying a context variable context [mb_typep] for a P slice to syntax elements Mb_Type_P and a syntax element SubMb_Type_P. As shown in the figure, seven context variables of 14 to 20 are assigned to the syntax element Mb_Type_P whereas the following three context variables of 21 to 23 are assigned to the syntax element SubMb_Type_P.

FIG. 3C is a diagram showing typical assignment of context indexes each identifying a context variable context [mb_type_b] for a B slice to syntax elements Mb_Type_B and a syntax element SubMb_Type_B. As shown in the figure, nine context variables of 27 to 35 are assigned to the syntax element Mb_Type_B whereas the following four context variables of 36 to 39 are assigned to the syntax element SubMb_Type_B.

FIGS. 4 to 8 are a plurality of variable-length code tables each showing relations between a syntax element, which can be mb_type or sub_mb_type, and Bin data in the CABAC decoding processing. To be more specific, FIG. 4 is a variable-length code table showing relations between the syntax element of Mb_Type_I which is mb_type of the I slice and Bin data. FIG. 5 is a variable-length code table showing relations between the syntax element of Mb_Type_P which is mb_type of the P slice and Bin data. FIG. 6 is a variable-length code table showing relations between the syntax element of Mb_Type_B which is mb_type of the B slice and Bin data. FIG. 7 is a variable-length code table showing relations between the syntax element of SubMb_Type_P which is sub_mb_type of the P slice and Bin data. FIG. 8 is a variable-length code table showing relations between the syntax element of SubMb_Type_B which is sub_mb_type of the B slice and Bin data.

The multi-value conversion section 24 refers to variable-length code tables of FIGS. 4 to 8 in order to produce a result of determination as to whether or not Bin data bit for the end of the syntax element has been obtained as a result of a Bin decoding process. If the result of the determination does not indicate that a Bin data for the end of the syntax element has been obtained, the Bin decoding process carried out by the binary-arithmetic code-decoding process section 21 to produce Bin data is repeated till the Bin data for the end of the syntax element is produced. As the Bin data for the end of the syntax element has been obtained, the multi-value conversion section 24 refers to the variable-length code tables of FIGS. 4 to 8 in order to output the multi-value signal of the syntax element.

Typical Hardware Configuration of the CABAC Decoder

Figure 9:
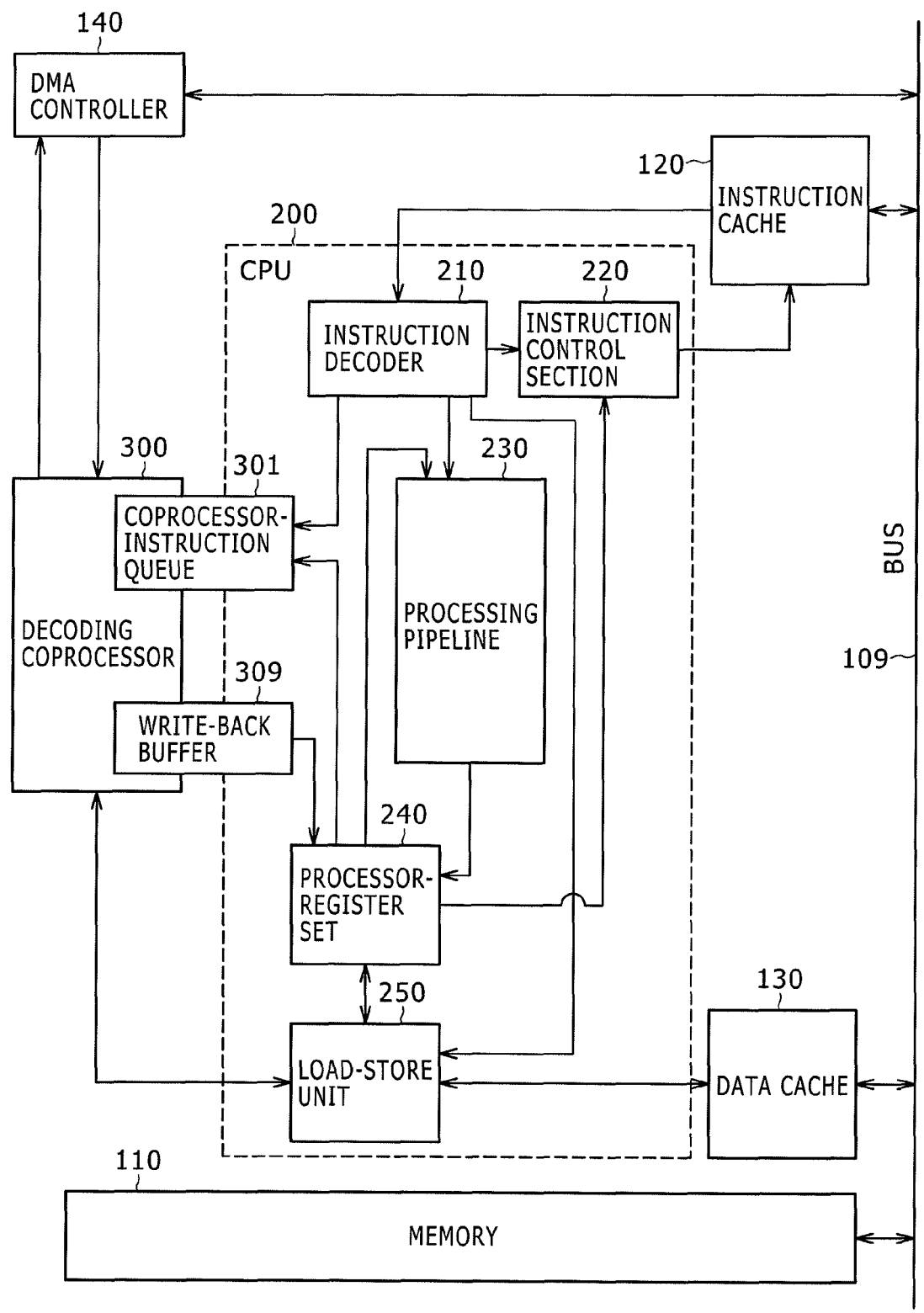
FIG. 9 is a block diagram showing a typical hardware configuration of the CABAC decoder according to the embodiment of the present invention.

FIG. 9 is a block diagram showing a typical hardware configuration of the CABAC decoder 20 according to the embodiment of the present invention. In accordance with the embodiment of the present invention, as shown in the figure, the CABAC decoder 20 is designed as an information processing apparatus which is configured to include the CPU 200 serving as a core section and a decoding coprocessor 300. The information processing apparatus is supposed to function as the CABAC decoder 20 in which the CPU 200 issues a coprocessor instruction for carrying out the CABAC decoding processing to the decoding coprocessor 300. To put it concretely, the information processing apparatus employs a memory 110, an instruction cache 120, a data cache 130, a DMA (Direct Memory Access) controller 140, a bus 109, the aforementioned CPU 200 and the decoding coprocessor 300 cited above.

The memory 110 is a main memory used for storing programs to be executed by the CPU 200 and the decoding coprocessor 300. The memory 110 is also used for storing information such as data to be processed in the execution of the programs. The instruction cache 120 is a single-level cache memory used for temporarily storing an instruction sequence of a program stored in the memory 110. The data cache 130 is a single-level cache memory used for temporarily storing data stored in the memory 110. The DMA controller 140 is a control section for carrying out a DMA (Direct Memory Access) transfer of transferring data stored in the memory 110 to the decoding coprocessor 300 or vice versa without moving the data through the CPU 200. The bus 109 is a bus for connecting the memory 110, the instruction cache 120, the data cache 130 and the DMA controller 140 to each other. The CPU 200 is a processor for executing an instruction fetched from the instruction cache 120. The decoding coprocessor 300 is a coprocessor for executing a coprocessor instruction supplied by the CPU 200.

The DMA controller 140 transfers a stream of data from the memory 110 to the decoding coprocessor 300 through the bus 109 in accordance with a request to start a transfer of the data stream. The data stream to be transferred begins at a read start address which has been set in advance in the DMA controller 140. The length of the data stream to be transferred is specified by a read data size which has also been set in advance in the DMA controller 140. In the transfer of the data stream, the data stream is read out sequentially from the memory 110 and transferred to the decoding coprocessor 300 through the bus 109 and the DMA controller 140. During an operation to shift codIOffset in the left direction as described later in the course of a renormalization process carried out by the decoding coprocessor 300, a stream composed of bits the number of which is equal to the shift quantity is included on the LSB side of codIOffset. In this way, the data stream is read out from the memory 110 automatically and the CABAC decoding processing is carried out.

The CPU 200 employs an instruction decoder 210, an instruction control section 220, a processing pipeline 230, a processor register set 240 and a load-store unit 250. The instruction decoder 210 is a section for decoding (or interpreting) an instruction fetched from the instruction cache 120. The instruction control section 220 is a section for determining which instruction is to be executed by the CPU 200. The instruction control section 220 has a PC (program counter). In a normal state, the program counter is updated by being incremented by one so that consecutive instructions are executed by the CPU 200. If the instruction decoder 210 detects a branch instruction as a result of the instruction decoding (interpreting) process and a jump to a specific instruction other than the instruction immediately following the currently decoded branch instruction has to be made, however, the instruction control section 220 updates the program counter to a value pointing to the specific instruction which serves as the destination of the branch. The processing pipeline 230 is a pipelined processor. For the sake of simplicity, only one pipeline is shown in the block diagram of FIG. 9. If necessary, however, a plurality of pipelines can be provided as the processing pipeline 230. The processor register set 240 includes GPRs (general-purpose registers) and a CCR (condition-code register). The load-store unit 250 is a section for loading data from the memory 110 to registers by way of the data cache 130 and for storing data from the registers to the memory 110 by way of the data cache 130. In this case, the registers can be the processor register set 240 employed in the CPU 200 or a group of coprocessor registers to be described later as coprocessor registers employed in the decoding coprocessor 300.

A coprocessor instruction queue 301 and a write-back buffer 309 are provided between the CPU 200 and the decoding coprocessor 300. The coprocessor instruction queue 301 is a section for passing a coprocessor instruction from the CPU 200 to the decoding coprocessor 300. The write-back buffer 309 is a memory used for writing back data from the decoding coprocessor 300 to a general purpose register GPR included in the processor register set 240 employed in the CPU 200.

Right after being reset, the CPU 200 sequentially fetches instructions from an area included in the memory 110 as an area starting from a memory address determined in advance by way of the instruction cache 120 in accordance with the program counter of the instruction control section 220. In the CPU 200, the instruction decoder 210 decodes each individual one of the instructions, and control is executed in accordance with the result of the instruction decoding so as to drive sections desired in the execution of the individual instruction. If the decoded instruction is an instruction for the CPU 200, the processing pipeline 230 employed in the CPU 200 is driven to operate. If the decoded instruction is an instruction for the decoding coprocessor 300, on the other hand, the CPU 200 passes on the instruction to the decoding coprocessor 300 by way of the coprocessor instruction queue 301. If the decoding coprocessor 300 receives the instruction for the decoding coprocessor 300, the decoding coprocessor 300 interprets the instruction and carries out control necessary for the execution of the instruction. In accordance with the program counter of the instruction control section 220, the CPU 200 then fetches the next instruction and repeats the processing described above.

If the result of the instruction decoding process carried out by the instruction decoder 210 indicates that the instruction is a branch instruction, however, it is necessary to make a jump to the memory address of a branch destination. In this case, the address of the jump destination is set in the program counter of the instruction control section 220. Then, the CPU 200 sequentially fetches instructions from an area included in the memory 110 as an area starting from the memory address of the branch destination. A branch instruction can be an unconditional branch instruction or a conditional branch instruction. In the case of an unconditional branch instruction, it is necessary to unconditionally make a jump to the memory address of a branch destination. In the case of a conditional branch instruction, on the other hand, a jump to the memory address of a branch destination is made in accordance with whether a BC (branch code) has a value of 0 or 1. The BC is a bit in the CCR (condition code register). It is possible to provide a conditional branch instruction to make a jump to the memory address of a branch destination if the BC is 0 and a conditional branch instruction to make a jump to the memory address of a branch destination if the BC is 1. The CCR (condition code register) has a plurality of bits each used as the BC. For example, a BC bit of the CCR is set at 1 or reset to 0 in accordance with the result of execution of an instruction for carrying out a comparison process. As another example, another BC bit of the CCR is set at 1 or reset to 0 in accordance with the result of execution of an instruction for carrying out a logic process.

Figure 10:
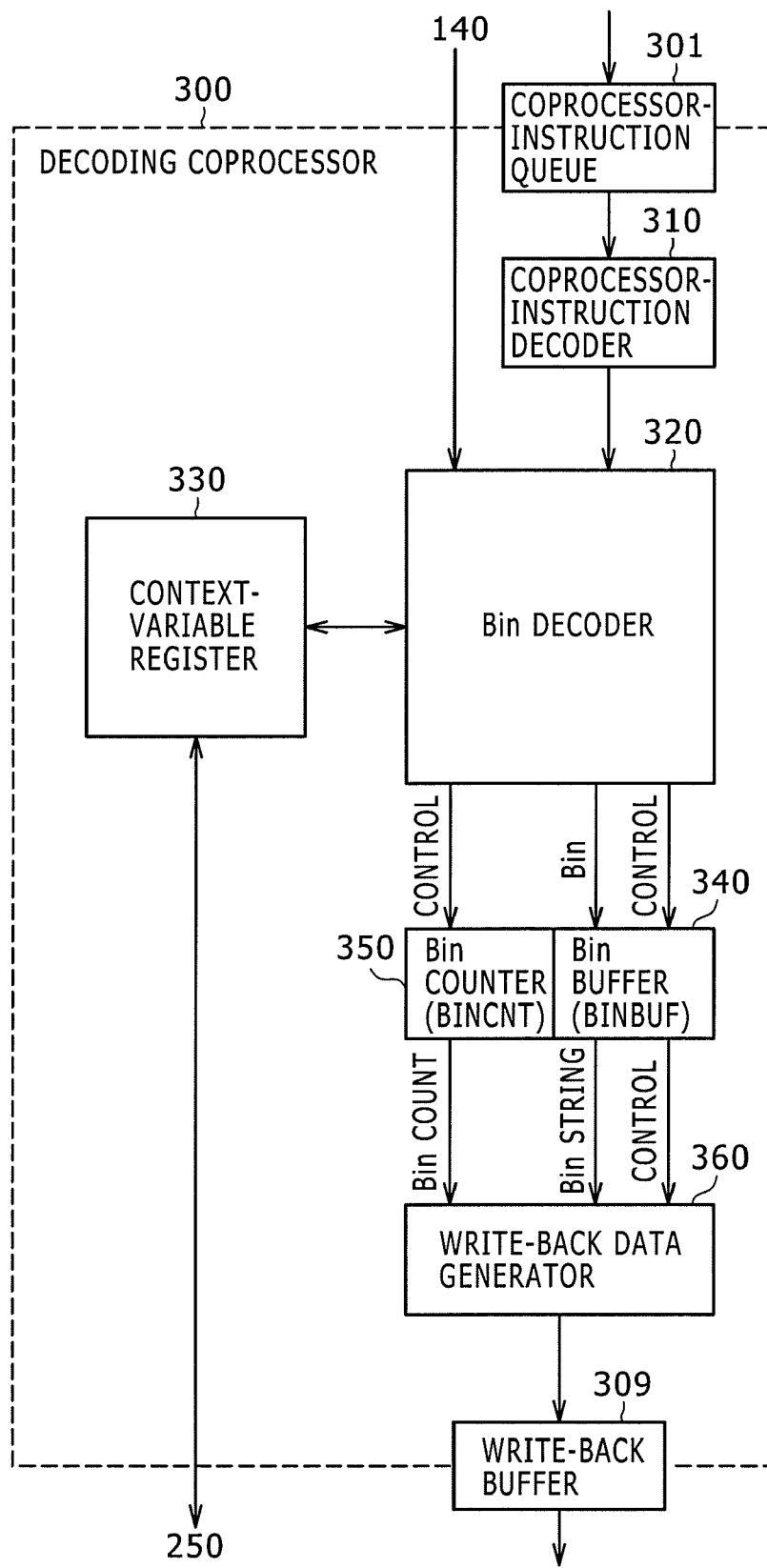
FIG. 10 is a block diagram showing a typical configuration of a decoding coprocessor employed in the CABAC decoder according to the embodiment of the present invention.

FIG. 10 is a block diagram showing a typical configuration of the decoding coprocessor 300 according to the embodiment of the present invention. As shown in the figure, the decoding coprocessor 300 employs a coprocessor instruction decoder 310, a Bin decoder 320, a context-variable register 330, a Bin buffer 340, a Bin counter 350 and a write-back data generator 360.

The coprocessor instruction decoder 310 is an instruction decoder for decoding (or interpreting) a coprocessor instruction which is supplied thereto by way of the coprocessor instruction queue 301. The coprocessor instruction decoder 310 is a typical example of an instruction decoder described in a claim appended to this invention specification.

The Bin decoder 320 is a decoder for carrying out a Bin decoding process of decoding encoded data, which is received from the DMA controller 140, in order to generate Bin data. The Bin decoder 320 is a typical example of an arithmetic decoding execution section described in a claim appended to this invention specification.

The context-variable register 330 is a register for holding context variables desired in the Bin decoding process of generating Bin data. The context-variable register 330 has a typical length of 128 bits for storing 16 context variables which each have a size of 8 bits. Context variables are exchanged between the context-variable register 330 and the memory 110 in accordance with a coprocessor load instruction or a coprocessor store instruction. To put it in detail, prior to CABAC decoding processing to generate a syntax element, context variables for the syntax element are loaded from the memory 110 to the context-variable register 330 in accordance with the coprocessor load instruction (at the step S902 of the flowchart shown in FIG. 2). Then, the entire syntax element is generated by carrying out the CABAC decoding processing. Later on, prior to CABAC decoding processing to generate the next syntax element, the context variables for the syntax element obtained as a result of the previous CABAC decoding processing are stored from the context-variable register 330 to the memory 110 in accordance with the coprocessor store instruction (at the step S904 of the flowchart shown in FIG. 2). Then, context variables for the next syntax element are loaded from the memory 110 to the context-variable register 330 in accordance with the coprocessor load instruction. In this way, sets each composed of desired context variables are sequentially loaded from the memory 110 to the context-variable register 330 and used in the CABAC decoding processing.

In the CABAC decoding processing, it is possible to identify one of 16 context variables by making use of a context number (the relative context index) cidx which is composed of 4 bits. In actuality, the number of context variables for every syntax element is known to be 16 at the very most as indicated by the number of cidx values shown in the diagrams of FIG. 3. That is to say, the context number cidx is used to identify one of 16 context variables stored in the context-variable register 330 and processing corresponding to a process of computing a context index ctxIdx can be implemented. Thus, the Bin decoder 320 can also be simplified as well. In addition, instead of making accesses to a large-size SRAM for storing all context variables, the Bin decoding process can be carried out by making accesses to the data cache 130 having a smaller size. Thus, the CABAC decoder 20 can be implemented by a circuit having a small scale. It is to be noted that, as described above, every 8 bits of the context-variable register 330 are assumed to be allocated to one context variable. Since a context variable is implemented as 7 bits, however, the context-variable register 330 can be configured to have 112 bits.

It is also worth noting that context variables are loaded from the memory 110 to the context-variable register 330 in accordance with the coprocessor load instruction and the context variables are laid out in the context-variable register 330 in such a way that every context variable identified by a context index ctxIdx corresponds to a value of the context number cidx as shown in the diagrams of FIG. 3. In addition, the coprocessor store instruction is executed to transfer the context variables laid out in the context-variable register 330 to locations selected from those in the memory 110 as locations used for originally storing the context variables.

The Bin buffer 340 denoted by symbol BINBUF is a buffer for holding a history of Bin data obtained as a result of Bin decoding processes carried out by the Bin decoder 320. The Bin buffer 340 is typically a shift register which is composed of at least 7 bits. Thus, the Bin buffer 340 can be used for holding up to seven pieces of Bin data (or 7 Bin-data bits) at the same time. The Bin buffer 340 is a typical example of a history holding section described in a claim appended to this invention specification.

The Bin counter 350 denoted by symbol BINCNT is a counter for counting the number of Bin-data bits decoded by the Bin decoder 320. The Bin decoder 320 is cleared to set the contents thereof at 0 when the head of a syntax element is generated in the CABAC decoding processing from Bin data. Thus, the length of the Bin-data bit string can be acquired from the Bin counter 350 as the number of Bin-data bits held in the Bin buffer 340 after the process of the BIN decoding processing to generate the syntax element has been ended.

The write-back data generator 360 is a section for carrying out a fabrication process on the Bin data stored in the Bin buffer 340 by referring to the values of the Bin data. A typical example of the fabrication process is a process of fetching the Bin data in bit units. Data obtained as a result of the fabrication process is transfer to a general purpose register GPR or a condition code register CCR in the CPU 200 by way of the write-back buffer 309. The write-back data generator 360 is also provided with a function for carrying out a matching process in addition to the data fabrication process which is simple. The matching process function is a function to specify a plurality of bit patterns to be compared with the history of Bin data held in the Bin buffer 340 and to generate 1 on the condition that the history of the Bin data matches one of the bit patterns or generate 0 on the condition that the history of the Bin data matches none of the bit patterns. The conditions used in the matching process are each referred to as a matching condition. It is to be noted that the write-back data generator 360 is a typical example of a matching process section described in a claim appended to this invention specification.

2: Coprocessor Instructions

Outline of an Instruction Set

FIG. 11 is a table showing a typical instruction set for the CABAC decoding processing according to the embodiment of the present invention. A portion enclosed in brackets [ ] on a mnemonic column represents an optional operand which can be omitted from the instruction. Symbol cpr means any one of coprocessor registers which include the Bin buffer 340 and the Bin counter 350 in addition to the context-variable register 330.

Each of a cbc_dec_bin instruction, a cbc_dec_bin_cc instruction and cbc_dec_term_cc instruction is a Bin decoding instruction for carrying out a Bin decoding process based on the CABAC technique by making use of the Bin decoder 320 in order to generate Bin data. In execution of the cbc_dec_bin instruction, the immediate value of the context number cidx specified as an operand in the instruction is added to the contents of a general purpose register GPR [rs] indicated by an rs operand value also specified in the instruction in order to find a sum (cidx+GPR [rs]). The general purpose register GPR [rs] is a general purpose register GPR which is identified by a register number indicated by the rs operand. The sum (cidx+GPR [rs]) is then used for specifying one of context variables CTX which have been stored in the context-variable register 330 in advance. The context variable CTX identified by the sum (cidx+GPR [rs]) is denoted by symbol CTX (cidx+GPR [rs]). The context variable CTX (cidx+GPR [rs]) identified by the sum (cidx+GPR [rs]) is used in the Bin decoding process of generating a Bin-data bit which is then additionally stored in the Bin buffer 340. Every time a Bin-data bit is additionally stored in the Bin buffer 340, the contents of the Bin counter 350 are incremented by 1. An optional CEX0 operand value can be specified in the cbc_dec_bin instruction. A cbc_dec_bin instruction including the optional CEX0 operand value is executed only if the Bin data generated right before is 0. By the same token, an optional CEX1 operand value can be specified in the cbc_dec_bin instruction. A cbc_dec_bin instruction including the optional CEX1 operand value is executed only if the Bin data generated right before is 1. In addition, an optional CINC0 operand value can be specified in the cbc_dec_bin instruction. A cbc_dec_bin instruction including the optional CINC0 operand value is executed to carry out a Bin decoding process by making use of a context variable CTX (cidx+GPR [rs]+1) if the Bin data generated right before is 0. By the same token, an optional CINC1 operand value can be specified in the cbc_dec_bin instruction. A cbc_dec_bin instruction including the optional CINC1 operand value is executed to carry out a Bin decoding process by making use of a context variable CTX (cidx+GPR [rs]+1) if the Bin data generated right before is 1. On top of that, an optional CLR operand value can be specified in the cbc_dec_bin instruction. When a cbc_dec_bin instruction including the optional CLR operand value is executed in order to carry out a Bin decoding process, the Bin buffer 340 and the Bin counter 350 are cleared prior to the Bin decoding process. That is to say, when a cbc_dec_bin instruction including the optional CLR operand value is executed in order to carry out a Bin decoding process, the Bin buffer 340 is made empty and the contents of the Bin counter 350 are set at 0 prior to the Bin decoding process. As a piece of Bin data is generated later on, the contents of the Bin counter 350 are incremented by 1 from 0 to 1.

The cbc_dec_bin_cc instruction is executed in order to store Bin data obtained as a result of a Bin decoding process in a specific bit of the condition code register CCR. A cc operand specified in the cbc_dec_bin_cc instruction is used to specify the specific bit of the condition code register CCR. The other operands of the cbc_dec_bin_cc instruction are the same as those specified in the cbc_dec_bin instruction.

The cbc_decterm_cc instruction is executed in order to carry out a Bin decoding process of generating Bin data by setting pStateIdx at 63 and valMPS at 0. A Bin-data bit obtained as a result of the execution of the cbc_dec_term_cc instruction is additionally stored in the Bin buffer 340. Every time a Bin-data bit is additionally stored in the Bin buffer 340, the contents of the Bin counter 350 are incremented by 1. In addition, the Bin data obtained as a result of a Bin decoding process is stored in a specific bit of the condition code register CCR. A cc operand specified in the cbc_dec_term_cc instruction is used to specify the specific bit of the condition code register CCR.

A cbc_match instruction is a Bin matching instruction to be executed for driving the write-back data generator 360 to carry out a matching process. To put it in detail, the cbc_match instruction is executed to carry out a matching process of comparing each of specific operands specified in the instruction with the four LSB-side bits of the Bin buffer 340 used as a subject of comparison. The four LSB-side bits of the Bin buffer 340 represent the four most recent Bin-data bits. In the following description, the Bin-data bit generated most recently is also referred to as the first most recent Bin-data bit, the most recent Bin-data bit immediately preceding the first most recent Bin-data bit is referred to as the second most recent Bin-data bit, the most recent Bin-data bit immediately preceding the second most recent Bin-data bit is referred to as the third most recent Bin-data bit and so on. If a set of match patterns each listed as one of the specific operands of the cbc_match instruction includes a pattern identical with the four LSB-side bits of the Bin buffer 340, 1 is set at the CCR (Condition Code Register) bit specified by a cc operand of the cbc_match instruction. If the set of match patterns each listed as one the specific operands of the cbc_match instruction does not include a pattern identical with the four LSB-side bits of the Bin buffer 340, on the other hand, 0 is set at the CCR (Condition Code Register) bit specified by the cc operand of the cbc_match instruction.

In the mnemonic of the cbc_match instruction, notations ptn0, ptn1 and so on are the match patterns each listed as one of the specific operands of the cbc_match instruction. For example, each of the match patterns ptn0, ptn1, ptn2 and so on is four successive characters which can each be one of three different characters, i.e., 0, 1 and x. The first, second, third and fourth ones of the four successive characters composing a match pattern are to be compared with respectively the first, second, third and fourth ones of the four most recent Bin-data bits. To put it more concretely, as an example, let the match patterns ptn0, ptn1, ptn2 and so on be 0001, xxx1, x10x and so on respectively. If the first, second, third and fourth ones of the four most recent Bin-data bits are 0, 0, 0 and 1 respectively, the match pattern ptn0 of 0001 is said to match (or to be identical with) the four most recent Bin-data bits.

By the way, the character x in a match pattern represents a don't-care bit. That is to say, the character x in a match pattern represents both 0 and 1 bits. Thus, the match pattern ptn1 of xxx1 represents all match patterns which each include the first bit of 1 without regard to what values the remaining bits have. By the same token, the match pattern ptn2 of x10x represents all match patterns which each include the second bit of 1 and the third bit of 0 without regard to what values the remaining bits have.

The set of match patterns {ptn0, ptn1, ptn3, ptn4} each listed as one of the specific operands of the cbc_match instruction as described above is a set of immediate values which form a 16-bit bit map. Typically, the value of 1 (or 0) set at a bit of the bit map is set at a corresponding bit of each of the match patterns as a value to be compared with the value of a corresponding bit of the four most recent Bin-data bits.

A cbc_tblidx instruction is a multi-value conversion table-index instruction for fabricating the values of Bin data stored in the Bin buffer 340 in order to align the Bin data to that stored in a code table. Bin data is defined by the code table as data having a variable length and is variable length codes that can each be obtained as a unique result of a Bin decoding process. Thus, if a code table created by making use of an index of the code table is prepared in advance, the execution of a multi-value conversion process becomes convenient. The index of a code table is a bit count for carrying out a left-shifting operation to align the MSB (Most Significant Bit) of the longest code to the MSB of each variable-length code. The cbc_tblidx instruction includes a w operand specifying a maximum bit count of a syntax element obtained as a result of the CABAC decoding processing. The cbc_tblidx instruction is executed to shift the contents of the Bin buffer 340 in the left direction by (BINCNT–w) bits where notation BINCNT denotes the index of the code table. Thus, the contents of the Bin buffer 340 are fabricated so that the Bin-data bit corresponding to the head of the syntax element becomes the MSB of the value of the w bits. In addition, the cbc_tblidx instruction also includes another rd operand specifying a register number. In accordance with the cbc_tblidx instruction, the data of the w bits is stored in a general purpose register GPR [rd] indicated by the register number rd which is specified as the other operand.

Each of a cbc_MbTypeI instruction, a cbc_MbTypeP instruction, a cbc_MbTypeB instruction, a cbc_SubMbTypeP instruction and a cbc_SubMbTypeB instruction is a multi-value conversion instruction. Each of these multi-value conversion instructions is executed to compute a multi-value signal of a syntax element from Bin data stored in the Bin buffer 340 and the contents of the Bin counter 350 in accordance with a decoding procedure which is prescribed in the H.264 specifications shown in the diagrams of FIGS. 4 to 8. The computed multi-value signal is stored in a general purpose register GPR [rd] indicated by a register number rd which is specified as an rd operand in each of the instructions.

Each of the coprocessor instructions explained so far is passed on from the CPU 200 to the decoding coprocessor 300 by way of the coprocessor instruction queue 301 and executed by the decoding coprocessor 300. In addition to the coprocessor instructions, processor instructions are executed by the CPU 200 for carrying out the CABAC decoding processing. The processor instructions executed by the CPU 200 are explained as follows.

A cbc_ldq instruction is a load instruction for loading data from the memory 110 to a coprocessor register which is employed in the decoding coprocessor 300. The cbc_ldq instruction is executed in order to read out data having a size of 128 bits from an address in the memory 110 and store the data in the coprocessor register indicated by an operand cpr which is specified in the instruction.

A cbc_stq instruction is a store instruction for storing data from a coprocessor register which is employed in the decoding coprocessor 300 to the memory 110. The cbc_stq instruction is executed in order to read out data having a size of 128 bits from the coprocessor register indicated by an operand cpr specified in the instruction and store the data at an address in the memory 110.

A br instruction is a conditional branch instruction for conditionally making a jump to the address of a branch destination in accordance with a branch condition code. The br instruction is executed in order to conditionally make a jump to an address specified by an operand addr of the instruction to indicate an address in the memory 110 provided that the value of the CCR (Condition Code Register) bit specified by a cc operand of the instruction equal to an operand v of the instruction. The address specified by the operand addr of the br instruction to indicate an address in the memory 110 is the address of the branch destination cited above.

A jpr instruction is an unconditional branch instruction for unconditionally making a jump to the address of a branch destination without regard to a branch condition code. The jpr instruction is executed in order to unconditionally make a jump to an address specified by an operand addr of the instruction to indicate an address in the memory 110 without regard to the contents of the CCR (Condition Code Register). The address specified by the operand addr of the instruction to indicate an address in the memory 110 is the address of the branch destination cited above.

Typical Instruction Formats of the Coprocessor Instructions

Figure 12A:
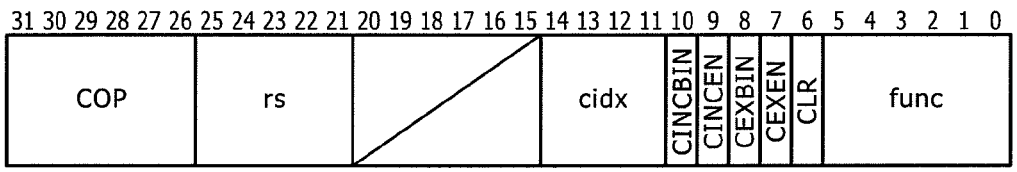
FIGS. 12A to 12F are a plurality of diagrams each showing a typical format of a coprocessor instruction which is executed in order to carry out the CABAC decoding processing in the embodiment of the present invention.
Figure 12B:
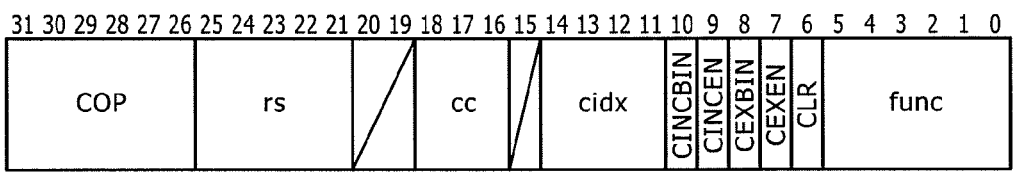
Figure 12C:
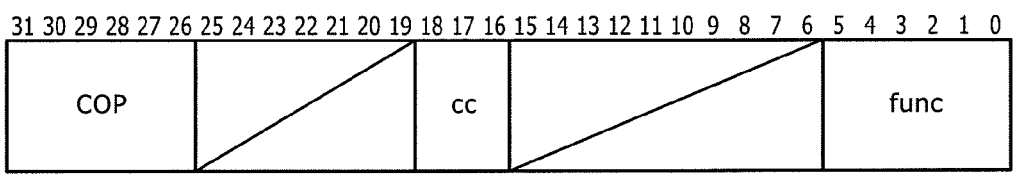
Figure 12D:
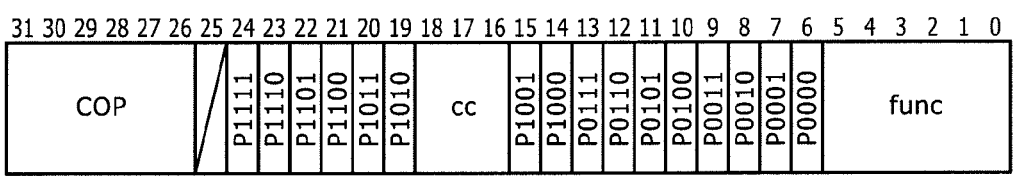
Figure 12E:
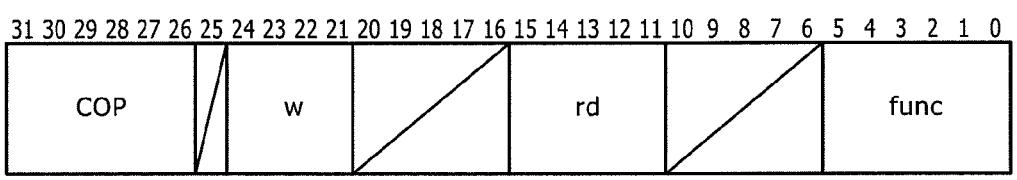
Figure 12F:
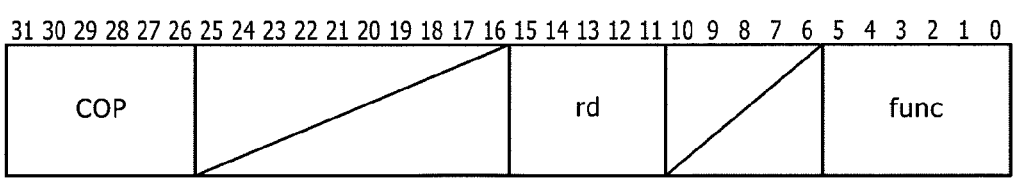

FIGS. 12A to 12F are a plurality of diagrams each showing a typical format of a coprocessor instruction which is executed in order to carry out the CABAC decoding processing in the embodiment of the present invention. To be more specific, FIG. 12A is a diagram showing a typical format of the cbc_dec_bin instruction whereas FIG. 12B is a diagram showing a typical format of the cbc_dec_bin_cc instruction. FIG. 12C is a diagram showing a typical format of the cbc_dec_term_cc instruction whereas FIG. 12D is a diagram showing a typical format of the cbc_match instruction. FIG. 12E is a diagram showing a typical format of the cbc_tblidx instruction whereas FIG. 12F is a diagram showing a typical format of each of the cbc_MbTypeI instruction, the cbc_MbTypeP instruction, the cbc_MbTypeB instruction, the cbc_SubMbTypeP instruction and the cbc_SubMbTypeB instruction.

Bits 31 to 26 of the instruction format of every coprocessor instruction are allocated to a COP which is common to all the coprocessor instructions. Bits 5 to 0 are allocated to a code for indicating the function of the coprocessor instruction. Bits 25 to 21 are allocated to the rs operand whereas bits 15 to 11 are allocated to the rd operand. Each of the rs and rd operands is a register number which is assigned to a general purpose register GPR. The w operand set at bits 24 to 21 specifies the number of bits to serve as the subject of the multi-value conversion table-index instruction described previously. The cc operand set at bits 18 to 16 represents the position of a bit in the condition code register CCR. The cidx operand set at bits 14 to 11 represents a context number. The CLR operand value set at bit 6 is an optional operand serving as a flag which indicates whether or not to clear the Bin buffer 340 and the Bin counter 350 prior to the Bin decoding process.

Sixteen PXXXX fields set at bits 24 to 19 and bits 15 to 6 as shown in the diagram of FIG. 12D are used for setting the four match patterns described above. Symbol XXXX represents bits of a match pattern. As described before, if any of the XXXX values matches the four most recent Bin-data bits (or the four LSB-side bits) of the Bin buffer 340, 1 is set at the CCR (Condition Code Register) bit specified by a cc field set at bits 18 to 16. If none of the XXXX values matches the four most recent Bin-data bits (or the four LSB-side bits) of the Bin buffer 340, on the other hand, 0 is set at the CCR (Condition Code Register) bit specified by a cc field set at bits 18 to 16. The number of bits represented by symbol XXXX is 4 because the number of most recent Bin-data bits to be compared respectively with the bits represented by symbol XXXX is assumed to be 4. Sixteen bits composed of bits 24 to 19 and bits 15 to 6 can thus be used to specify four match patterns which are each composed of 4 bits having values of 0 and 1. The 16 bits form a bit map which is composed of 16 bits. In other words, the 16-bit bit map is composed of the four match patterns which each set a matching condition. Each of the four matching conditions is a candidate to be compared with the four most recent Bin-data bits. Thus, by setting the value of 1 at a plurality of bits of the bit map at the same time, a group of candidates each setting a matching condition can be defined.

A cbc_match instruction is a Bin matching instruction executed as a comparison instruction having a function to determine whether or not the four most recent Bin-data bits are included in the bit map which serves as the set of candidates each setting a matching condition. The function to determine whether or not the four most recent Bin-data bits are included in the bit map is carried out by comparing the four most recent Bin-data bits with bits of the bit map. A result of the comparison carried out by the Bin matching instruction is set at the CCR (Condition Code Register) bit specified by a cc field of the instruction as a branch condition code BC which is referenced later by the br instruction serving as a conditional branch instruction. Thus, depending on whether or not the four most recent Bin-data bits are included in the bit map serving as the set of candidates each setting a matching condition, the flow of a program may make a jump at the execution of the conditional branch instruction. The Bin matching instruction includes the cc field set at bits 18 to 16. The cc field indicates the CCR (Condition Code Register) bit at which the result of the comparison carried out by the Bin matching instruction is set as the branch condition code BC. Typically, the condition code register CCR is composed of 8 bits. The 3 bits of the cc field are used to specify a specific one of eight bits of the condition code register CCR. The specific bit of the condition code register CCR is then used for storing the result of the comparison carried out by the Bin matching instruction as the branch condition code BC. Thus, as many sets each composed of four match patterns for four different matching conditions as bits composing the condition code register CCR can be defined. Accordingly, a plurality of different Bin matching instructions can be executed for a certain state of the Bin buffer 340. As a result, even a complicated branch process can be carried out by making use of very few conditional branch instructions.

Each of a CINCBIN field set at bit 10, a CINCEN field set at bit 9, a CEXBIN field set at bit 8 and a CEXEN field set at bit 7 is an optional field for optionally making use of the Bin data obtained as a result of a Bin decoding process carried out by execution of the immediately preceding Bin decoding instruction as an execution condition code EC. The CINCEN field serving as a conditional incrementing flag in a Bin decoding instruction is an optional field used to enable a conditional incrementing function to conditionally increment the value set in the cidx field by 1 in the execution of the Bin decoding instruction. That is to say, the conditional incrementing function is put in a state of being enabled only if the CINCEN field is set at 1. On the other hand, the CINCBIN field is an optional field used for determining a condition for execution of the conditional incrementing function. To put it in detail, with the conditional incrementing function put in a state of being enabled by setting the conditional incrementing flag CINCEN at 1, if the CINCBIN field is equal to the execution condition code EC, a Bin decoding process is carried out in the execution of the Bin decoding instruction in order to generate Bin data by executing the conditional incrementing function, that is, the Bin decoding process is carried out by making use of a context variable indicated by a number obtained as a result of incrementing the value set in the cidx field by 1. Even with the conditional incrementing function put in a state of being enabled by setting the conditional incrementing flag CINCEN at 1, if the CINCBIN field is not equal to the execution condition code EC, on the other hand, a Bin decoding process is carried out in the execution of the Bin decoding instruction in order to generate Bin data without executing the conditional incrementing function, that is, the Bin decoding process is carried out by making use of a context variable indicated by the cidx field as it is.

Likewise, the CEXEN field serving as a conditional incrementing flag in a Bin decoding instruction is an optional field used to enable a conditional execution function to conditionally carry out a Bin decoding process by execution of the Bin decoding instruction. That is to say, the conditional execution function is put in a state of being enabled only if the CEXEN field is set at 1. On the other hand, the CEXBIN field is an optional field used for determining a condition for execution of the conditional execution function. To put it in detail, the conditional execution function is conditionally carried out as follows. With the conditional execution function put in a state of being enabled by setting the conditional execution flag CEXEN at 1, if the CEXBIN field is equal to the execution condition code EC, a Bin decoding process is carried by execution of the Bin decoding instruction in order to generate Bin data. Even with the conditional execution function put in a state of being enabled by setting the conditional execution flag CEXEN at 1, if the CEXBIN field is not equal to the execution condition code EC, on the other hand, a Bin decoding process is not carried in order to generate Bin data, that is, the Bin decoding instruction is actually not carried out. In addition, in this case, a variety of registers are not updated to give the same effect as a NOP instruction.

If both the CINCEN field serving as a conditional incrementing flag and the CEXEN field serving as a conditional execution flag are set at 0, the Bin decoding process is carried out unconditionally in order to generate Bin data by making use of a context variable indicated by the cidx field without changing the value of the cidx field.

The CEXEN and CEXBIN fields are used for specifying a pair which is represented by a single operand value. To put it more concretely, in order to set the CEXEN field at 1 but the CEXBIN field at 0, CEX0 is specified as the value of an optional operand in the mnemonic shown in the table of FIG. 11. In order to set the CEXEN field at 1 and the CEXBIN field also at 1, on the other hand, CEX1 is specified as the value of the optional operand in the mnemonic shown in the table of FIG. 11.

By the same token, the CINCEN and CINCBIN fields are also used as a pair which is represented by a single operand value as well. In order to set the CINCEN field at 1 but the CINCBIN field at 0, CINC0 is specified as the value of another optional operand in the mnemonic shown in the table of FIG. 11. In order to set the CINCEN field at 1 and the CINCBIN field also at 1, on the other hand, CINC1 is specified as the value of the other optional operand in the mnemonic shown in the table of FIG. 11.

Typical Configuration of the Bin Decoder 320

Figure 13:
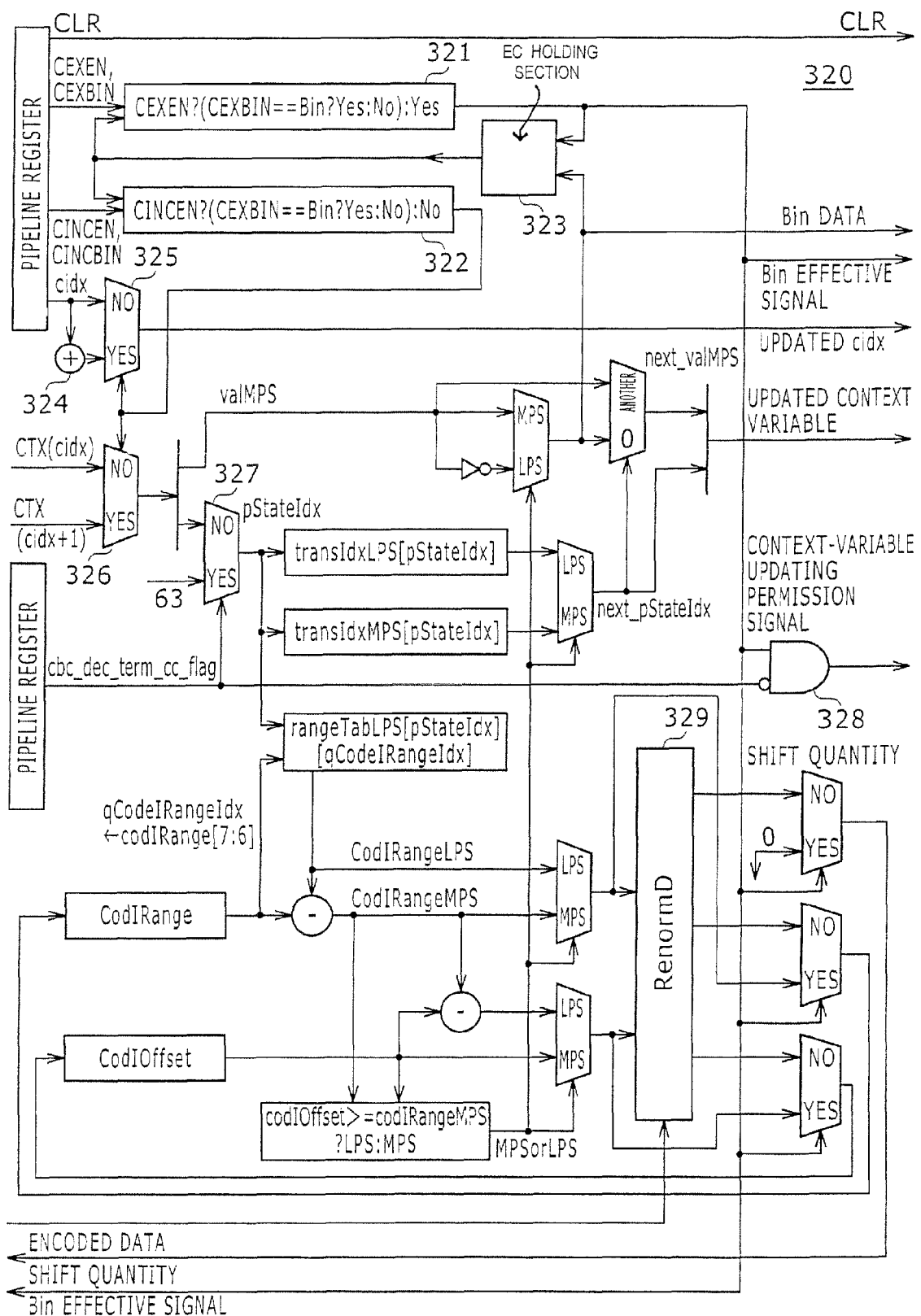
FIG. 13 is a block diagram showing a typical configuration of a Bin decoder employed in the decoding coprocessor according to the embodiment of the present invention.
Figure 14:
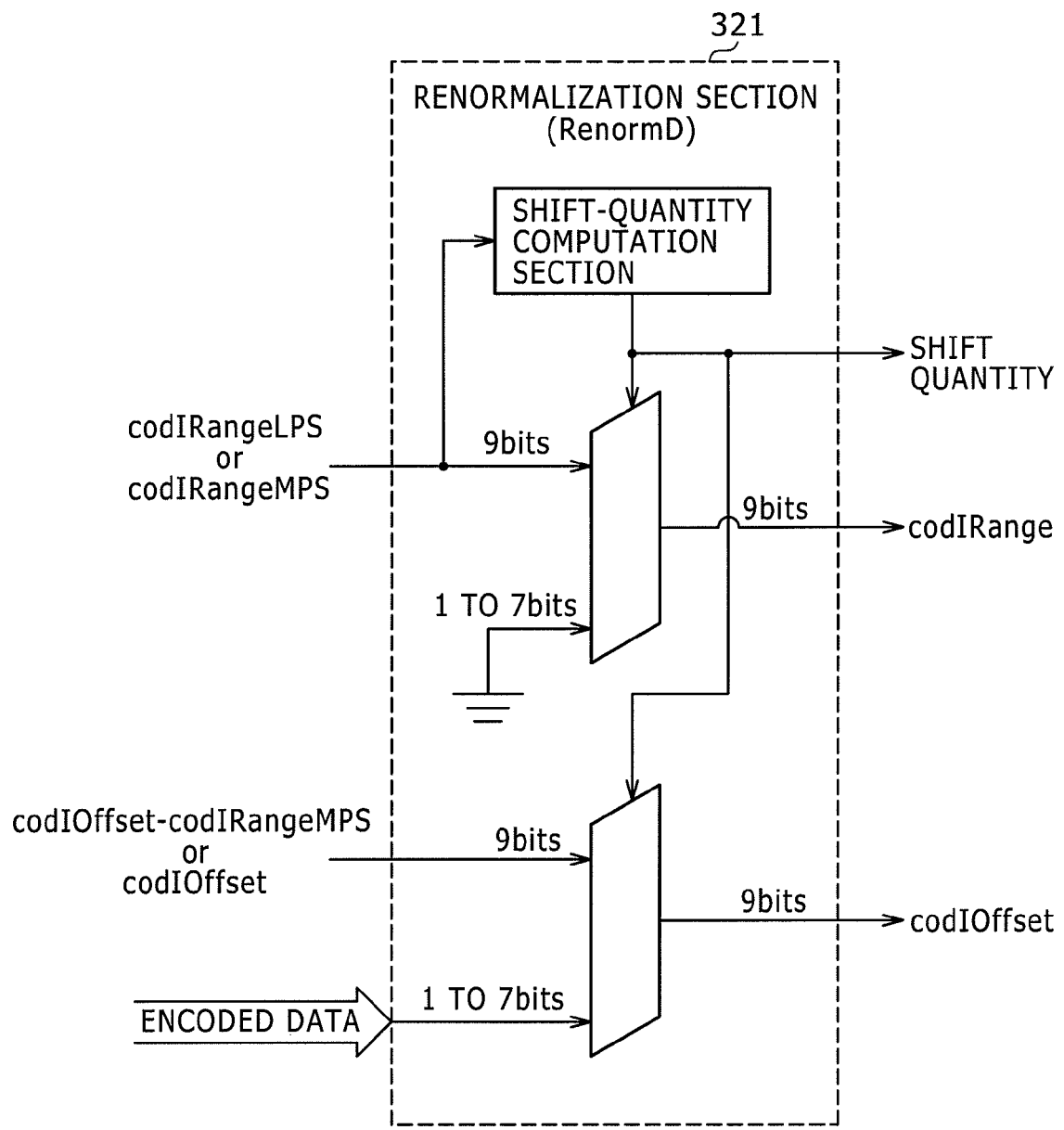
FIG. 14 is a block diagram showing a typical configuration of a renormalization process section employed in the Bin decoder according to the embodiment of the present invention.

Each of FIGS. 13 and 14 is a block diagram showing a typical configuration of the Bin decoder 320 according to the embodiment of the present invention.

In a process of decoding one symbol, a context variable CTX including a probability state index pStateIdx and valMPS is read out from the context-variable register 330. In addition, a value set at bits 7 and 6 of an internal state variable codIRange is set in qCodIRangeIdx. Then, a referenced value denoted by notation rangeTabLPS [pStateIdx] [qCodIRangeIdx] is set in codIRangeLPS whereas a value obtained as a result of subtracting codIRangeLPS from codIRange is set in codIRangeMPS.

At that time, if codIOffset is equal to or greater than codIRangeMPS, the decoding result is an LPS, a value obtained as a result of subtracting codIRangeMPS from codIOffset is used as updated codIOffset, codIRangeLPS is used as updated codIRange and an updated value of the context variable is calculated.

If codIOffset is smaller than codIRangeMPS, on the other hand, the decoding result is an MPS, codIRangeMPS is used as updated codeIRange and an updated value of the context variable is calculated.

Then, the internal state variable codIRange and codIOffset are each taken as a subject of a renormalization process.

If the decoding result is an LPS, the inverted value of valMPS is output as decoded data. In addition, the next state of the probability state index pStateIdx is found from transIdxLPS [pStateIdx] of a transition table. At that time, if transIdxLPS [pStateIdx] is 0, valMPS is inverted. Then, an updated value of the context variable is calculated by making use of the found next state of the probability state index pStateIdx and valMPS or inverted valMPS.

If the decoding result is an MPS, on the other hand, valMPS is output as data obtained as a decoding result. In addition, the next state of the probability state index pStateIdx is found from transIdxMPS [pStateIdx] of a transition table and an updated value of the context variable is calculated by making use of the found next state of the probability state index pStateIdx and valMPS.

If codIRange is smaller than 0x0100 (=256), a renormalization process section 329 shifts codIRange and codIOffset in the left direction on a bit-after-bit basis till codIRange becomes equal to or greater than 0x0100 and inserts 1 bit of the encoded-data stream into the LSB of codeIOffset every time codIOffset is shifted in the left direction by 1 bit.

A Bin-data bit obtained as a result of the Bin decoding process is inserted into the LSB of Bin data stored in the Bin buffer 340 after the Bin data is shifted in the left direction by 1 bit. At that time, the contents of the Bin counter 350 are incremented by 1.

If necessary, a signal obtained as a result of a Bin decoding operation carried out by the coprocessor instruction decoder 310 is latched in a pipeline register. For example, a cbc_dec_term_cc_flag is a flag used to indicate that a cbc_dec_term_cc instruction has been decoded. As options, the CLR, CEXEN, CEXBIN, CINCEN, CINCBIN and cidx operand values can also be used.

Bin data obtained as a result of the Bin decoding process carried out by execution of the immediately preceding Bin decoding instruction is held also in an execution condition code (EC) holding section 323 as an execution condition code. In the case of the cbc_dec_bin instruction or the cbc_dec_bin_cc instruction, if the CEXEN operand value specified in this Bin decoding instruction is 0, an execution determination section 321 determines that the Bin decoding instruction is to be unconditionally executed and puts a Bin effective signal in a state indicating effective status of the Bin decoding instruction but, if the CEXEN operand value is 1, on the other hand, the execution determination section 321 puts the conditional execution function described earlier in a state of being enabled. With the conditional-execution function put in a state of being enabled, if the CEXBIN operand value matches the execution condition code EC held in the execution condition code holding section 323, the Bin decoding instruction is determined to be executed and the Bin effective signal is put in a state indicating effective signal status of the Bin decoding instruction. If the CEXBIN operand value does not match the execution condition code EC held in the execution condition code holding section 323, on the other hand, the Bin decoding instruction is determined not to be executed and the Bin effective signal is put in a state indicating ineffective status of the Bin decoding instruction. It is to be noted that the execution condition code holding section 323 is a typical example of an execution condition code holding section described in a claim appended to this invention specification.

In addition, in the case of the cbc_dec_bin instruction or the cbc_dec_bin_cc instruction, if the CINCEN operand value specified in this Bin decoding instruction is 0, an incrementing determination section 322 determines that the context number cidx specified as an operand in the Bin decoding instruction is not to be incremented but, if the CINCEN operand value is 1, on the other hand, the incrementing determination section 322 puts the conditional incrementing function in a state of being enabled. With the conditional-incrementing function put in a state of being enabled, if the CINCBIN operand value matches the execution condition code EC held in the execution condition code holding section 323, the incrementing determination section 322 determines that the context number cidx specified as an operand in the Bin decoding instruction is to be incremented but, if the CINCBIN operand value does not match the execution condition code EC held in the execution condition code holding section 323, on the other hand, the incrementing determination section 322 determines that the context number cidx specified as an operand in the Bin decoding instruction is not to be incremented. If the incrementing determination section 322 determines that the context number cidx specified as an operand in the Bin decoding instruction is not to be incremented, a selector 325 selects the context number cidx specified as an operand of the instruction as a context number as it is whereas a selector 326 selects a context variable CTX (cidx) indicated by the context number cidx. If the incrementing determination section 322 determines that the context number cidx specified as an operand in the Bin decoding instruction is to be incremented, on the other hand, an adder 324 increments the context number cidx specified as an operand of the instruction by 1 and outputs the incremented context number (cidx+1) to the selector 325. Then, the selector 325 selects the incremented context number (cidx+1) received from the adder 324 whereas a selector 326 selects a context variable CTX (cidx+1) indicated by the incremented context number (cidx+1). The number of context variables stored in the context-variable register 330 is assumed to be 16 which is a value corresponding to cidx values in the range 0 to 15. Thus, when the adder 324 increments the context number cidx having a value of 15, the adder 324 outputs a context number cidx of 0 as an incremented context number cidx.

In the case of the cbc_dec_term_cc instruction, a selector 327 selects the integer number 63 as pStateIdx. In addition, in the case of the cbc_dec_term_cc instruction, even if the Bin effective signal is not put in a state indicating effective status of the cbc_dec_term_cc instruction, a logic integration circuit 328 masks a context-variable updating permission signal so that the context variable is not updated.

The Bin effective signal and a shift quantity, which are each obtained as a result of the Bin decoding process, are supplied to the DMA controller 140. If the Bin effective signal has been put in a state indicating effective status of the Bin decoding instruction and the shift quantity is at least 1, the Bin data obtained as a result of the Bin decoding process is assumed to have been consumed and the DMA controller 140 updates its output which is encoded data.

The Bin effective signal obtained as a result of the Bin decoding process and the CLR operand value latched in the pipeline register are supplied to the Bin counter 350. If the Bin effective signal has been put in a state indicating effective status of the Bin decoding instruction, the contents of the Bin counter 350 is incremented by 1. In this case, if the CLR operand value indicates an active state meaning that the contents of the Bin counter 350 are to be cleared, the contents of the Bin counter 350 are set at 1 which is a value implying that the Bin-data bit obtained as a result of the Bin decoding process is the first bit of the Bin data.

3: Typical Applications
Typical Application to an I-slice Macroblock Type

Figure 15:
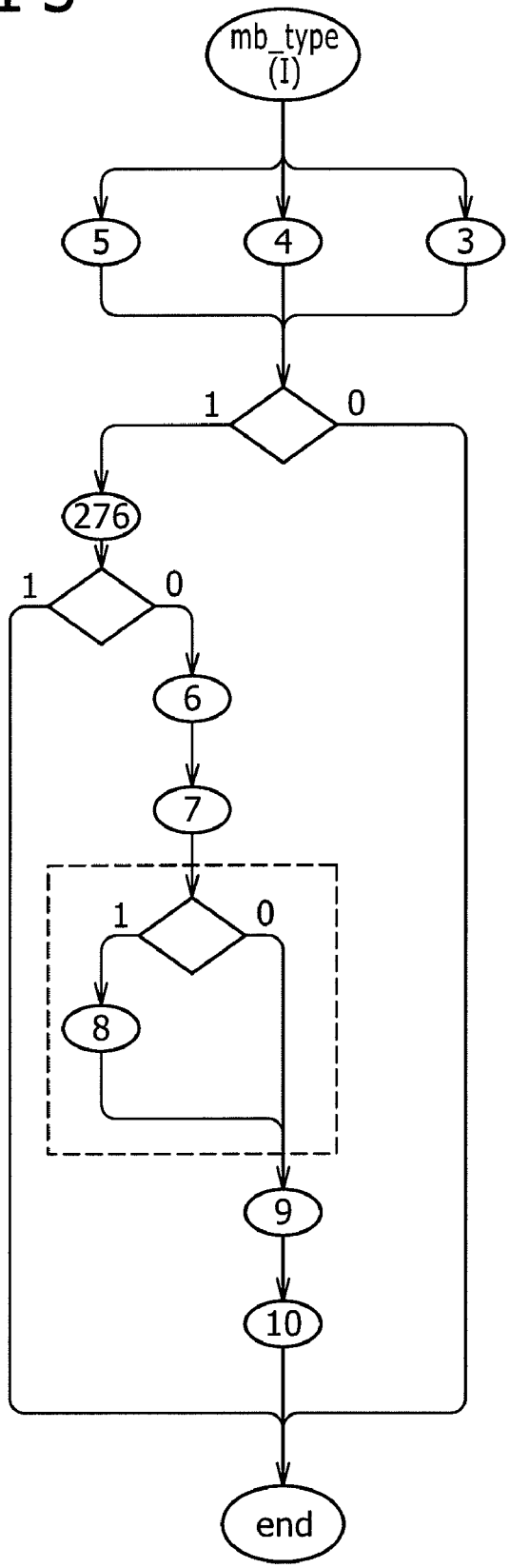
FIG. 15 is a state-transition diagram showing state transitions which occur in CABAC decoding processing to generate a syntax element of an I-slice macroblock type.

FIG. 15 is a state-transition diagram showing state transitions which occur in CABAC decoding processing to generate a syntax element of an I-slice macroblock type.

A number inside every ordinary node is a context index which is used for identifying a context variable used in a Bin decoding process carried out in a state represented by the ordinary node. A state transition occurs in the downward direction of the state-transition diagram.

At every ordinary node, a context index represented by a number assigned to the ordinary node identifies a context variable which is used in a Bin decoding process carried out in a state represented by the ordinary node to generate a Bin-data bit. A state transition may be made from any particular node to another ordinary node connected by a branch to the particular node. In a state represented by the other ordinary node, a Bin decoding process is carried out again in order to generate another Bin-data bit.

A label of 0 or 1 is appended to a branch connecting a branch node to a branch-destination node to serve as a label which is to be compared with the value of the Bin-data bit resulting from a Bin decoding process carried out in a state represented by a node immediately preceding the branch node. In this case, a state transition is made from the branch node to the branch-destination node through a branch with its appended label matching the value of the Bin-data bit obtained as a result of the Bin decoding process carried out in a state represented by a node immediately preceding the branch node.

On the other hand, an ordinary node is connected to a transition-destination node by a branch which does not have an appended label. The branch having no appended label indicates that a state transition is typically made from the ordinary node to the transition-destination node without regard to the value of a Bin-data bit obtained as a result of the Bin decoding process carried out in a state represented by the ordinary node.

A branch-destination node or a transition-destination node may be an end node. In this case, in a Bin decoding process carried out in a state represented by a node preceding the end node, the Bin-data bit corresponding to the end of a syntax element has been generated, completing the CABAC decoding processing to generate the entire syntax element.

In the CABAC decoding processing described above by referring to the state transitions shown in the state-transition diagram of FIG. 15 as state transitions which occur in the CABAC decoding processing to generate a syntax element of an I-slice macroblock type, a context variable identified by a context index of 3, 4 or 5 is initially used for generating a Bin-data bit as a result of the first Bin decoding process. Then, the result of the first decoding process is used to determine the state transition from a state in which a conditional branch instruction following the first Bin decoding process is executed.

FIG. 16 shows a typical program composed of instructions pertaining to an instruction set according to the embodiment of the present invention to serve as a program to be executed for carrying out CABAC decoding processing to generate a syntax element of an I-slice macroblock type.

The load instruction on line 1 of the program shown in FIG. 16 is executed in order to load context variables from the memory 110 to the context-variable register 330. The Bin decoding instruction on line 2 of the program is executed in order to carry out a Bin decoding process by making use of a context variable identified by a context index of 3, 4 or 5 so as to generate a Bin-data bit. Since the CLR operand value is specified in the Bin decoding instruction on line 2, data stored in the Bin buffer 340 and the contents of the Bin counter 350 are cleared prior to the execution of the Bin decoding instruction. The Bin-data bit obtained as a result of the Bin decoding process is stored in the CCR (Condition Code Register) bit indicated by the cc0 operand value specified in the Bin decoding instruction. In conjunction with the cidx operand value of 0, the gpr1 operand value of the rs operand specifies a value of the context index to be used for identifying one of the context variables which have been stored in the context-variable register 330. To put it in detail, the gpr1 operand value identifies a specific general purpose register, the contents of which are to be added to the cidx operand value of 0 to produce a sum to be used as a context index for identifying one of the context variables. In this case, it is assumed that a value of 3, 4 or 5 has been stored in advance in the specific general purpose register.

The conditional branch instruction on line 3 of the program shown in FIG. 16 is executed in order to make a jump to the store instruction on line 11 of the program if the Bin-data bit obtained as a result of the Bin decoding process carried out by the Bin decoding instruction on line 2 is 0. If the Bin-data bit obtained as a result of the Bin decoding process carried out by the Bin decoding instruction on line 2 is 1, on the other hand, the flow of the program goes on from the conditional branch instruction on line 3 to the Bin decoding instruction on line 4.

The Bin decoding instruction on line 4 of the program shown in FIG. 16 is executed in order to carry out a Bin decoding process by making use of a context variable identified by a context index of 276 so as to generate a Bin-data bit. The Bin-data bit obtained as a result of the Bin decoding process is stored in the CCR (Condition Code Register) bit indicated by the cc1 operand value specified in the Bin decoding instruction.

The Bin decoding instruction on line 5 of the program shown in FIG. 16 is executed in order to carry out a Bin decoding process by making use of a context variable identified by a context index of 6 (cidx=3 and rs=0) so as to generate a Bin-data bit. In this Bin decoding instruction, the operand value of 3 is the value of the cidx operand. On the other hand, the zero operand value specified in this Bin decoding instruction is equivalent to the statement rs=0 which means that the value of the rs operand is set at 0. In addition, the contents of the general purpose register GPR [rs (=0)] are assumed to have been set at 3. That is to say, the context index of 6 is the sum of cidx (=3) and GPR [rs] (=3). The CEX0 operand value specified in the Bin decoding instruction means that this Bin decoding process is carried out only if the Bin-data bit obtained as a result of the Bin decoding process carried out by execution of the immediately preceding Bin decoding instruction is 0.

The conditional branch instruction on line 6 of the program shown in FIG. 16 is executed in order to make a jump to the store instruction on line 11 of the program if the CCR (Condition Code Register) bit specified by the cc1 operand value is 1. As described above, the CCR bit specified by the cc1 operand value should have been used for storing the Bin-data bit obtained as a result of the Bin decoding process carried out by the Bin decoding instruction on line 4. If the CCR bit specified by the cc1 operand value is 0, on the other hand, the flow of the program goes on from the conditional branch instruction on line 6 to the Bin decoding instruction on line 7.

The Bin decoding instruction on line 7 of the program shown in FIG. 16 is executed in order to carry out a Bin decoding process by making use of a context variable identified by a context index of 7 (cidx=4 and rs=0) so as to generate a Bin-data bit. The Bin decoding instruction on line 8 of the program is executed in order to carry out a Bin decoding process by making use of a context variable identified by a context index of 8 (cidx=5 and rs=0) so as to generate a Bin-data bit. However, the Bin decoding instruction on line 8 of the program makes use of the conditional execution function by specifying the CEX1 operand value which means that this Bin decoding process is carried out only if the Bin-data bit obtained as a result of the Bin decoding process carried out by execution of the immediately preceding Bin decoding instruction is 1. In the same way, the Bin decoding instruction on line 9 of the program is executed in order to carry out a Bin decoding process by making use of a context variable identified by a context index of 9 (cidx=6 and rs=0) so as to generate a Bin-data bit. By the same token, the Bin decoding instruction on line 10 of the program is executed in order to carry out a Bin decoding process by making use of a context variable identified by a context index of 10 (cidx=7 and rs=0) so as to generate a Bin-data bit.

The store instruction on line 11 of the program shown in FIG. 16 is executed in order to store the context variables held in the context-variable register 330 in the memory 110. Then, the multi-value conversion instruction on line 12 of the program is executed in order to carry out a multi-value conversion process on the Bin-data bits each obtained as a result of one of the Bin decoding processes which have been carried out so far. Finally, the unconditional branch instruction on line 13 of the program is executed in order to make a jump to a return address.

Figure 17:
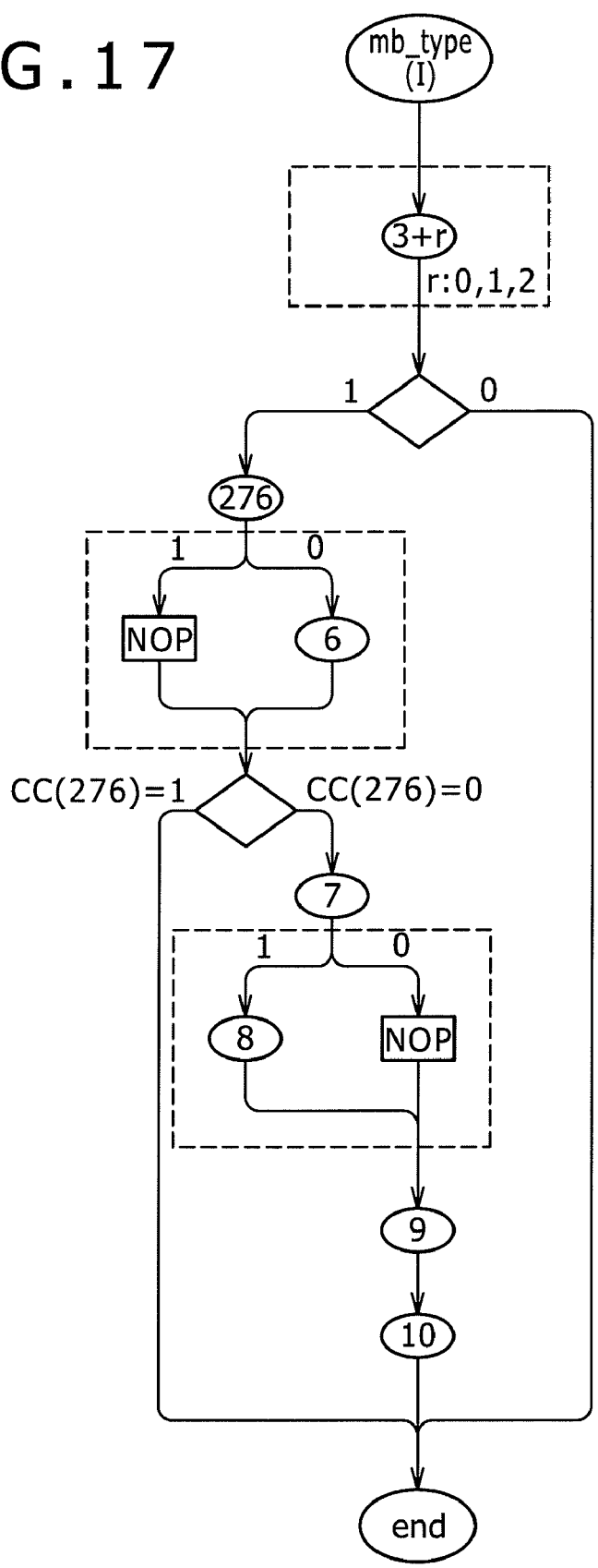
FIG. 17 is a state-transition diagram showing state transitions which occur in CABAC decoding processing to generate a syntax element of an I-slice macroblock type in accordance with the typical program shown in FIG. 16.

FIG. 17 is a state-transition diagram showing state transitions which occur in CABAC decoding processing to generate a syntax element of an I-slice macroblock type in accordance with the typical program shown in FIG. 16.

As described above, the Bin decoding instruction on line 2 of the program shown in FIG. 16 is executed in order to carry out a Bin decoding process by making use of a context variable identified by the initial context index of 3, 4 or 5 so as to generate a Bin-data bit. In order to carry out this Bin decoding process by making use of a Bin decoding instruction on one line, that is, line 2, one of the initial context indexes has been stored in a general purpose register specified in the Bin decoding instruction.

The Bin decoding instruction on line 2 of the program shown in FIG. 16 is executed in a state which is represented by an ordinary node with a context number of (3+r) in the state-transition diagram of FIG. 17 where notation r denotes the value of 0, 1 and 2.

In addition, the conditional branch instruction on line 6 of the program shown in FIG. 16 is executed in order to make a jump to the store instruction on line 11 of the program if the CCR (Condition Code Register) bit specified by the cc1 operand value is 1, or the flow of the program goes on from the conditional branch instruction on line 6 to the Bin decoding instruction on line 7 if the CCR bit specified by the cc1 operand value is 0. As described above, the CCR bit specified by the cc1 operand value should have been used for storing the Bin-data bit obtained as a result of the Bin decoding process carried out by the Bin decoding instruction on line 4. Thus, the conditional branch instruction on line 6 of the program has to be executed after the Bin-data bit obtained as a result of the Bin decoding process carried out by the Bin decoding instruction on line 4 has been set at the CCR bit. However, it takes time to complete the execution of this Bin decoding instruction. This situation gives rise to a wait time which is the time that it takes to establish the branch condition at the CCR bit. This wait time is the so-called latency of the Bin decoding instruction which establishes the branch condition for the conditional branch instruction on line 6. In order to conceal this latency, the Bin decoding instruction on line 5 of the program is executed between lines 4 and 6 of the program so as to carry out a Bin decoding process by making use of a context variable identified by a context index of 6. In this way, while this Bin decoding process is being carried out, the branch condition is established at the CCR bit.

The Bin decoding instruction on line 4 of the program shown in FIG. 16 is executed in a state which is represented by an ordinary node with a context number of 276 in the state-transition diagram of FIG. 17. The Bin decoding instruction on line 5 of the same program is executed in a state which is represented by a dotted-line block enclosing an ordinary node with a context number of 6 in the same state-transition diagram. The conditional branch instruction on line 6 of the same program is executed in a state which is represented by a branch node with branches denoted by symbols cc(276)=1 and cc(276)=0 in the same state-transition diagram.

In addition, the Bin decoding instruction on line 8 of the program shown in FIG. 16 is executed in order to carry out a Bin decoding process by making use of a context variable identified by a context index of 8 so as to generate a Bin-data bit. The Bin decoding instruction on line 8 of the program deliberately makes use of a conditional execution function. The use of the conditional execution function allows a conditional branch instruction to be eliminated so that a pipeline stall can be avoided.

Typical Application to a P-slice Macroblock Type

Figure 18:
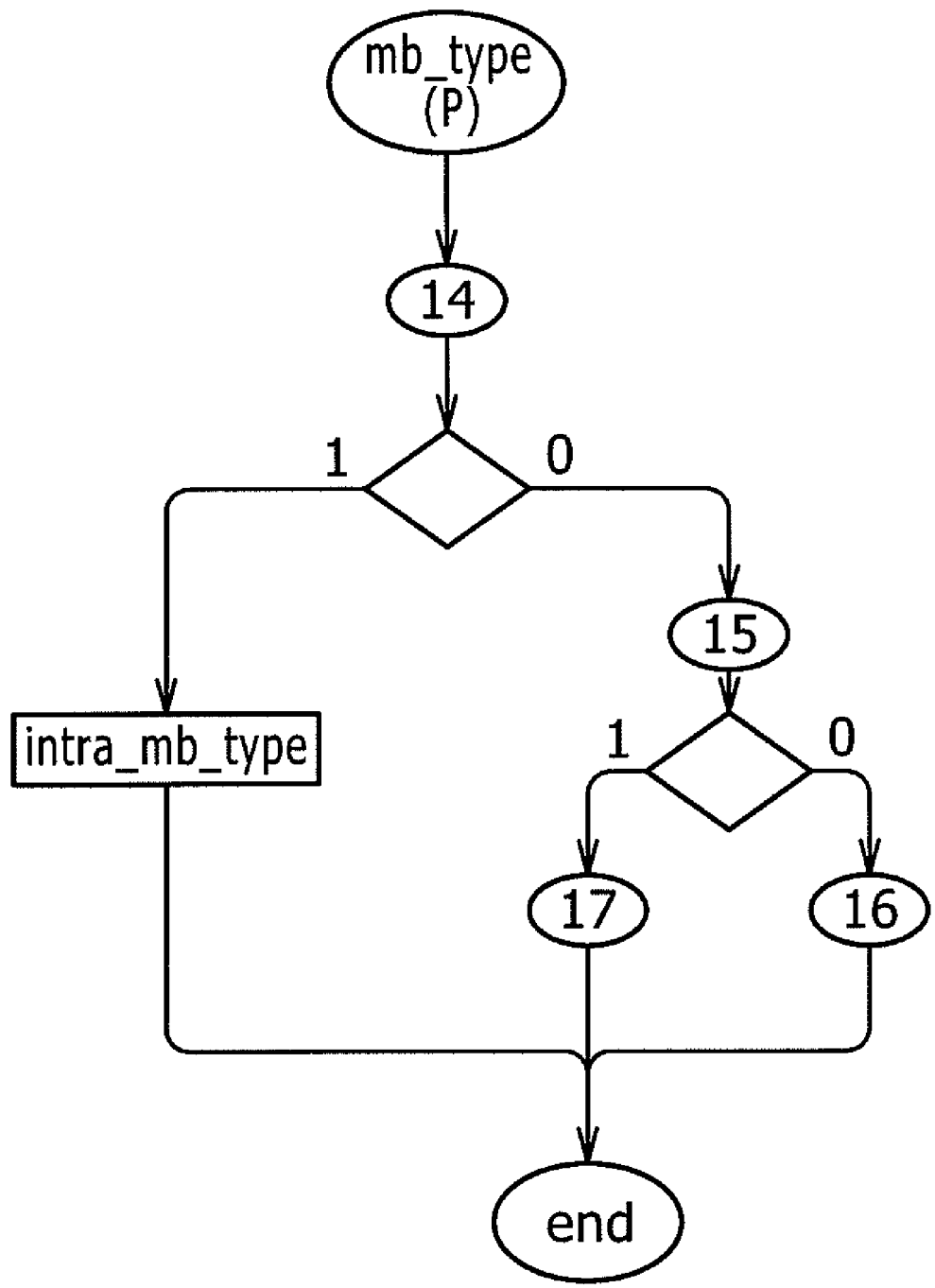
FIG. 18 is a state-transition diagram showing state transitions which occur in CABAC decoding processing to generate a syntax element of a P-slice macroblock type.
Figure 19:
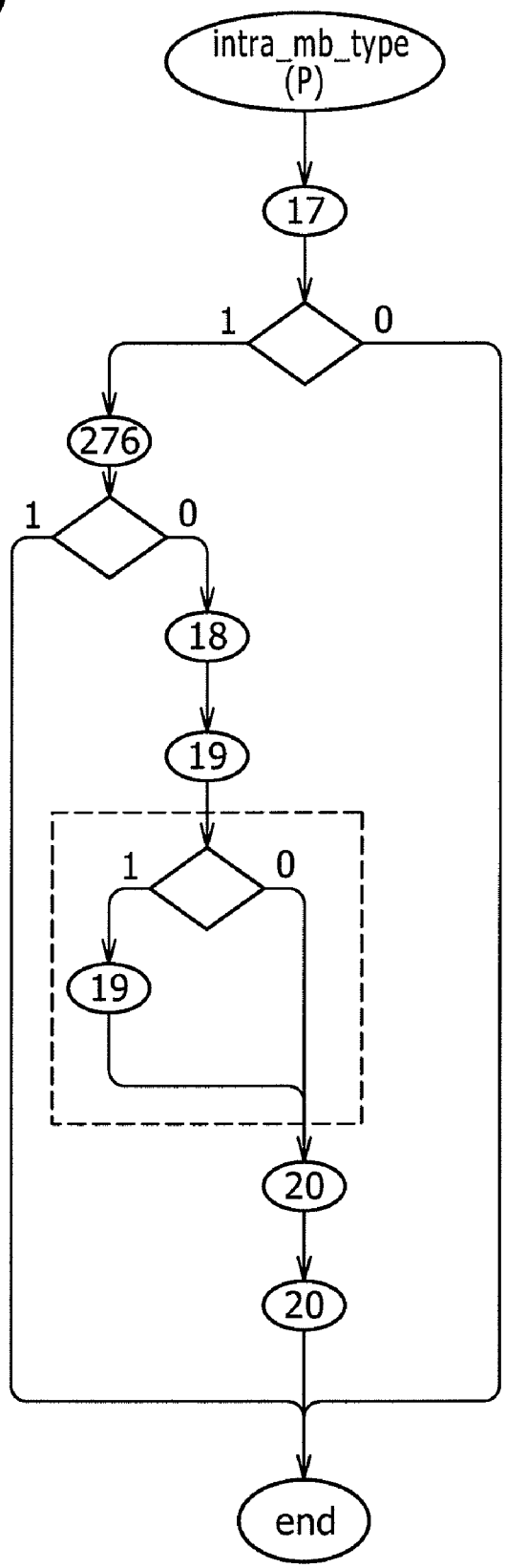
FIG. 19 is a state-transition diagram showing state transitions which occur in CABAC decoding processing to generate a syntax element inside a macroblock of a P-slice macroblock type.

FIGS. 18 and 19 are each a state-transition diagram showing state transitions which occur in CABAC decoding processing to generate a syntax element of a P-slice macroblock type. As shown in the state-transition diagram of FIG. 18, in the CABAC decoding processing to generate a syntax element of a P-slice macroblock type, initially, a context index of 14 is used for producing the first Bin-data bit. If the first Bin-data bit obtained as a result of the initial Bin decoding process is 1, Bin decoding processes are carried out for the inside of the macroblock as shown by the state-transition diagram of FIG. 19. If the first Bin-data bit obtained as a result of the initial Bin decoding process is 0, on the other hand, a transition to the next state is made. In the next state, a context index of 15 is used in a next Bin decoding process to generate another Bin-data bit. If the other Bin-data bit obtained as a result of the next Bin decoding process is 1, a transition is made to the following state in which a context variable identified by a context index of 17 is used in the following Bin decoding process to generate a further Bin-data bit. If the other Bin-data bit obtained as a result of the next Bin decoding process is 0, on the other hand, a transition is made to the following state in which a context variable identified by a context index of 16 is used in the following Bin decoding process to generate a further Bin-data bit.

FIG. 20 shows a typical program composed of instructions pertaining to an instruction set according to the embodiment of the present invention to serve as a program to be executed for carrying out CABAC decoding processing to generate a syntax element of a P-slice macroblock type.

The load instruction on line 1 of the program shown in FIG. 20 is executed in order to load context variables from the memory 110 to the context-variable register 330. The Bin decoding instruction on line 2 of the program is executed in order to carry out a Bin decoding process by making use of a context variable identified by a context index of 14 (cidx=0 and rs=0) so as to generate a Bin-data bit. In this Bin decoding instruction, the operand value of 0 is the value of the cidx operand. On the other hand, the zero operand value specified in this Bin decoding instruction is equivalent to the statement rs=0 which means that the value of the rs operand is set at 0.

In addition, the contents of the general purpose register GPR [rs (=0)] are assumed to have been set at 14. That is to say, the context index of 14 is the sum of cidx (=0) and GPR [rs] (=14). The Bin-data bit obtained as a result of the Bin decoding process is stored in the CCR (Condition Code Register) bit indicated by the cc0 operand value specified in the Bin decoding instruction. Since the CLR operand value is specified in the Bin decoding instruction on line 2, data stored in the Bin buffer 340 and the contents of the Bin counter 350 are cleared prior to the execution of the Bin decoding instruction.

The Bin decoding instruction on line 3 of the program shown in FIG. 20 is executed in order to carry out a Bin decoding process by making use of a context variable identified by a context index of 15 (cidx=1 and rs=0) so as to generate a Bin-data bit. The Bin decoding instruction on line 3 makes use of the conditional execution function by specifying the CEX0 operand value which means that this Bin decoding process is carried out only if the Bin-data bit obtained as a result of the Bin decoding process carried out by execution of the immediately preceding Bin decoding instruction is 0.

The Bin decoding instruction on line 4 of the program shown in FIG. 20 is executed in order to carry out a Bin decoding process by making use of a context variable identified by a context index of 16 or 17 (cidx=2, rs=0 and CINC1) so as to generate a Bin-data bit. The Bin decoding instruction on line 4 of the program makes use of the conditional incrementing function by specifying the CINC1 operand value which means that this Bin decoding process is carried out in accordance with the Bin-data bit obtained as a result of the Bin decoding process carried out by execution of the immediately preceding Bin decoding instruction. To be more specific, this Bin decoding process is carried out by making use of a context variable identified by a context index of 16 (=cidx+GPR [0]) if the Bin-data bit obtained as a result of the Bin decoding process carried out by execution of the immediately preceding Bin decoding instruction is 0 or making use of a context variable identified by a context index of 17 (=cidx+GPR [0]+1) obtained as a result of incrementing (cidx+GPR [0]) by 1 if the Bin-data bit obtained as a result of the Bin decoding process carried out by execution of the immediately preceding Bin decoding instruction is 1. The Bin-data bit obtained as a result of the Bin decoding process is stored in the CCR (Condition Code Register) bit indicated by the cc1 operand value specified in the Bin decoding instruction.

The conditional branch instruction on line 5 of the program shown in FIG. 20 is executed in order to make a jump to the store instruction on line 14 of the program if the CCR (Condition Code Register) bit specified by the cc0 operand value is 0. As described above, the CCR bit specified by the cc0 operand value should have been used for storing the Bin-data bit obtained as a result of the Bin decoding process carried out by the Bin decoding instruction on line 2. If the CCR bit specified by the cc0 operand value is 1, on the other hand, the flow of the program goes on from the conditional branch instruction on line 5 to the conditional branch instruction on line 6.

The conditional branch instruction on line 6 of the program shown in FIG. 20 is executed in order to make a jump to the store instruction on line 14 of the program if the CCR bit specified by the cc1 operand value is 0. As described above, the CCR bit specified by the cc1 operand value should have been used for storing the Bin-data bit obtained as a result of the Bin decoding process carried out by the Bin decoding instruction on line 4. If the CCR bit specified by the cc1 operand value is 1, on the other hand, the flow of the program goes on from the conditional branch instruction on line 6 to the Bit decoding instruction on line 7.

The Bin decoding instruction on line 7 of the program shown in FIG. 20 is executed in order to carry out a Bin decoding process by making use of a context variable identified by a context index of 276 so as to generate a Bin-data bit. The Bin-data bit obtained as a result of the Bin decoding process is stored in the CCR (Condition Code Register) bit indicated by the cc2 operand value specified in the Bin decoding instruction.

The Bin decoding instruction on line 8 of the program shown in FIG. 20 is executed in order to carry out a Bin decoding process by making use of a context variable identified by a context index of 18 (cidx=4 and rs=0) so as to generate a Bin-data bit. The Bin decoding instruction on line 8 of the program makes use of the conditional execution function by specifying the CEX0 operand value which means that this Bin decoding process is carried out only if the Bin-data bit obtained as a result of the Bin decoding process carried out by execution of the immediately preceding Bin decoding instruction is 0.

The conditional branch instruction on line 9 of the program shown in FIG. 20 is executed in order to make a jump to the store instruction on line 14 of the program if the CCR (Condition Code Register) bit specified by the cc2 operand value is 1. As described above, the CCR bit specified by the cc2 operand value should have been used for storing the Bin-data bit obtained as a result of the Bin decoding process carried out by the Bin decoding instruction on line 7. If the CCR bit specified by the cc2 operand value is 0, on the other hand, the flow of the program goes on from the conditional branch instruction on line 9 to the Bin decoding instruction on line 10.

The Bin decoding instruction on line 10 of the program shown in FIG. 20 is executed in order to carry out a Bin decoding process by making use of a context variable identified by a context index of 19 (cidx=5 and rs=0) so as to generate a Bin-data bit. The Bin decoding instruction on line 11 of the program is executed in order to carry out a Bin decoding process by making use of a context variable identified by a context index of 19 (cidx=5 and rs=0) so as to generate a Bin-data bit. The Bin decoding instruction on line 11 of the program makes use of the conditional execution function by specifying the CEX1 operand value which means that this Bin decoding process is carried out only if the Bin-data bit obtained as a result of the Bin decoding process carried out by execution of the immediately preceding Bin decoding instruction is 1.

The Bin decoding instruction on line 12 of the program shown in FIG. 20 is executed in order to carry out a Bin decoding process by making use of a context variable identified by a context index of 20 (cidx=6 and rs=0) so as to generate a Bin-data bit. By the same token, the Bin decoding instruction on line 13 of the program also carries out a Bin decoding process by making use of a context variable identified by a context index of 20 (cidx=6 and rs=0) so as to generate a Bin-data bit.

The store instruction on line 14 of the program shown in FIG. 20 is executed in order to store the context variables held in the context-variable register 330 in the memory 110. Then, the multi-value conversion instruction on line 15 of the program is executed in order to carry out a multi-value conversion process on the Bin-data bits each obtained as a result of one of the Bin decoding processes which have been carried out so far. Finally, the unconditional branch instruction on line 16 of the program is executed in order to make a jump to a return address.

Figure 21:
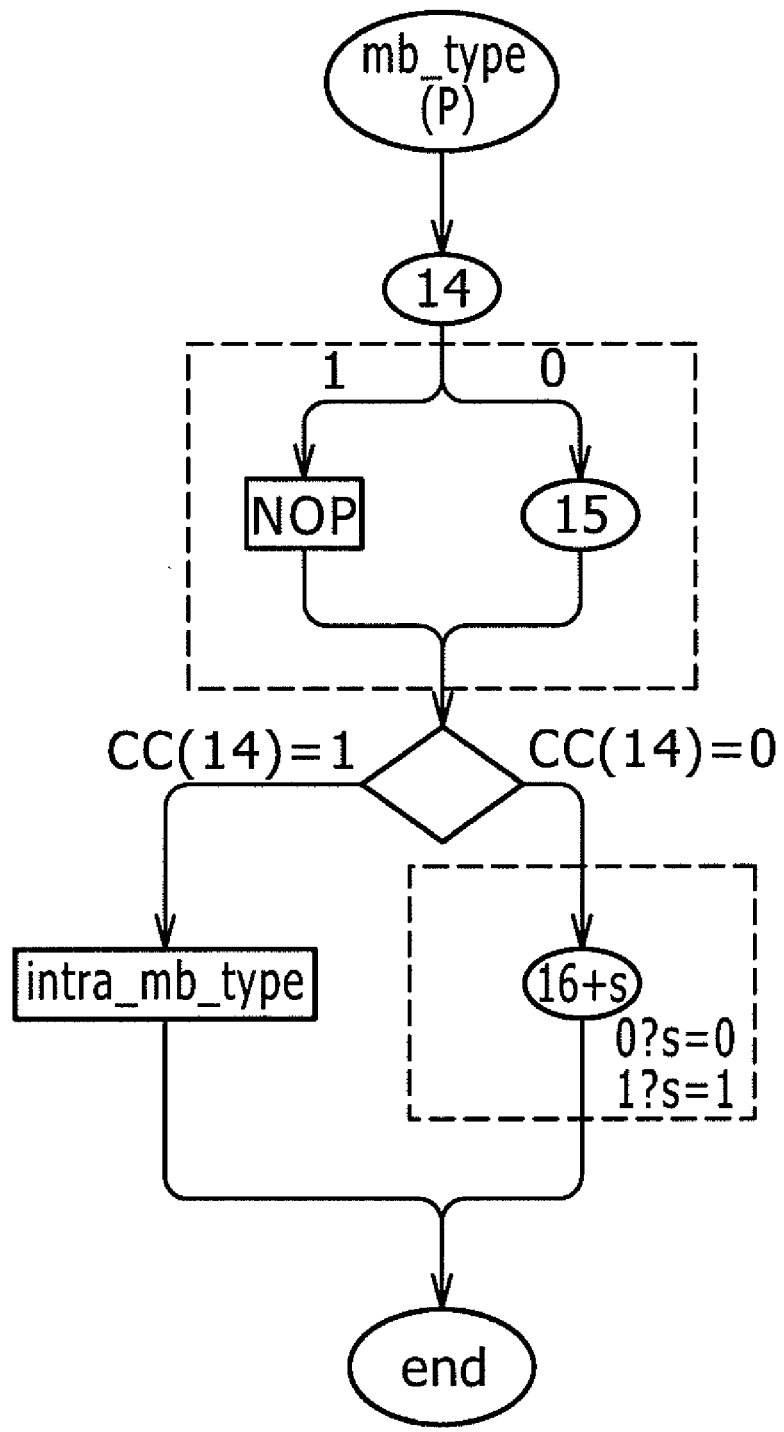
FIG. 21 is a state-transition diagram showing state transitions which occur in CABAC decoding processing to generate a syntax element of a P-slice macroblock type in accordance with the typical program shown in FIG. 20.
Figure 22:
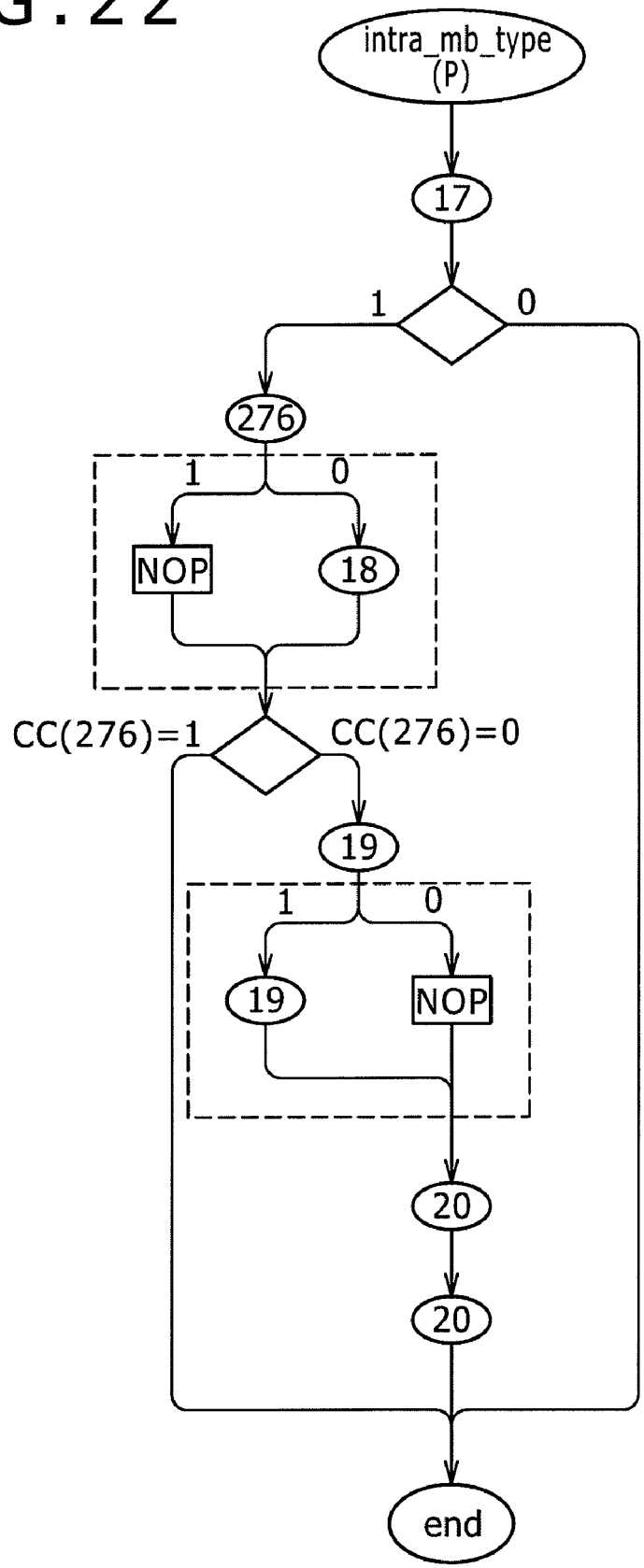
FIG. 22 is a state-transition diagram showing state transitions which occur in CABAC decoding processing to generate a syntax element inside a macroblock of a P-slice macroblock type in accordance with the typical program shown in FIG. 20.

FIGS. 21 and 22 are each a state-transition diagram showing state transitions which occur in CABAC decoding processing to generate a syntax element of a P-slice macroblock type in accordance with the typical program shown in FIG. 20.

The conditional branch instruction on line 5 of the program is executed in order to make a jump to the store instruction on line 14 of the program if the CCR (Condition Code Register) bit specified by the cc0 operand value is 0, or the flow of the program goes on from the conditional branch instruction on line 5 to the conditional branch instruction on line 6. As described above, the CCR bit specified by the cc0 operand value should have been used for storing the Bin-data bit obtained as a result of the Bin decoding process carried out by the Bin decoding instruction on line 2. Thus, the conditional branch instruction on line 5 of the program has to be executed after the Bin-data bit obtained as a result of the Bin decoding process carried out by the Bin decoding instruction on line 2 has been set at the CCR bit. However, it takes time to complete the execution of this Bin decoding instruction. This situation gives rise to a wait time which is the time that it takes to establish the branch condition at the CCR bit. This wait time is the so-called latency of the Bin decoding instruction which establishes the branch condition for the conditional branch instruction on line 5. In order to conceal this latency, the Bin decoding instruction on line 3 of the program is executed between lines 2 and 5 of the program so as to carry out a Bin decoding process by making use of a context variable identified by a context index of 15. In this way, while this Bin decoding process is being carried out, the branch condition is established at the CCR bit.

The Bin decoding instruction on line 2 of the program shown in FIG. 20 is executed in a state which is represented by an ordinary node with a context number of 14 in the state-transition diagram of FIG. 21. The Bin decoding instruction on line 3 of the same program is executed in a state which is represented by a dotted-line block enclosing an ordinary node with a context number of 15 in the same state-transition diagram. The conditional branch instruction on line 5 of the same program is executed in a state which is represented by a branch node with branches denoted by symbols cc(14)=1 and cc(14)=0 in the same state-transition diagram.

In addition, the Bin decoding instruction on line 4 of the program shown in FIG. 20 is executed in order to carry out a Bin decoding process by making use of a context variable identified by a context index of 16 or 17 so as to generate a Bin-data bit. The Bin decoding instruction on line 4 of the program deliberately makes use of a conditional incrementing function by specifying the CINC1 operand value which means that this Bin decoding process is carried out in accordance with the Bin-data bit obtained as a result of the Bin decoding process carried out by execution of the immediately preceding Bin decoding instruction. To be more specific, this Bin decoding process is carried out by making use of a context variable identified by a context index of 16 (=cidx+GPR[0]) if the Bin-data bit obtained as a result of the Bin decoding process carried out by execution of the immediately preceding Bin decoding instruction is 0 or making use of a context variable identified by a context index of 17 (=cidx+GPR[0]+1) obtained as a result of incrementing (cidx+GPR[0]) by 1 if the Bin-data bit obtained as a result of the Bin decoding process carried out by execution of the immediately preceding Bin decoding instruction is 1. The use of the conditional incrementing function allows the common Bin decoding instruction on line 4 of the program to be used in place of 2 different Bin decoding instructions and allows 2 conditional branch instructions to be eliminated so that a pipeline stall can be avoided.

In addition, the conditional branch instruction on line 9 of the program shown in FIG. 20 is executed in order to make a jump to the store instruction on line 14 of the program if the CCR (Condition Code Register) bit specified by the cc2 operand value is 1, or the flow of the program goes on from the conditional branch instruction on line 9 to the Bin decoding instruction on line 10. As described above, the CCR bit specified by the cc2 operand value should have been used for storing the Bin-data bit obtained as a result of the Bin decoding process carried out by the Bin decoding instruction on line 7. Thus, the conditional branch instruction on line 9 of the program has to be executed after the Bin-data bit obtained as a result of the Bin decoding process carried out by the Bin decoding instruction on line 7 has been set at the CCR bit. However, it takes time to complete the execution of this Bin decoding instruction. This situation gives rise to a wait time which is the time that it takes to establish the branch condition at the CCR bit. This wait time is the so-called latency of the Bin decoding instruction which establishes the branch condition for the conditional branch instruction on line 9. In order to conceal this latency, the Bin decoding instruction on line 8 of the program is executed between lines 7 and 9 of the program so as to carry out a Bin decoding process by making use of a context variable identified by a context index of 18. In this way, while this Bin decoding process is being carried out, the branch condition is established at the CCR bit.

The Bin decoding instruction on line 7 of the program shown in FIG. 20 is executed in a state which is represented by an ordinary node with a context number of 276 in the state-transition diagram of FIG. 22. The Bin decoding instruction on line 8 of the same program is executed in a state which is represented by a dotted-line block enclosing an ordinary node with a context number of 18 in the same state-transition diagram. The conditional branch instruction on line 9 of the same program is executed in a state which is represented by a branch node with branches denoted by symbols cc(276)=1 and cc(276)=0 in the same state-transition diagram.

In addition, the Bin decoding instruction on line 11 of the program shown in FIG. 20 is executed in order to carry out a Bin decoding process by making use of a context variable identified by a context index of 19. The Bin decoding instruction on line 11 of the program deliberately makes use of the conditional execution function. The use of the conditional execution function allows a conditional branch instruction to be eliminated so that a pipeline stall can be avoided.

Typical Application to a B-slice Macroblock Type

Figure 23:
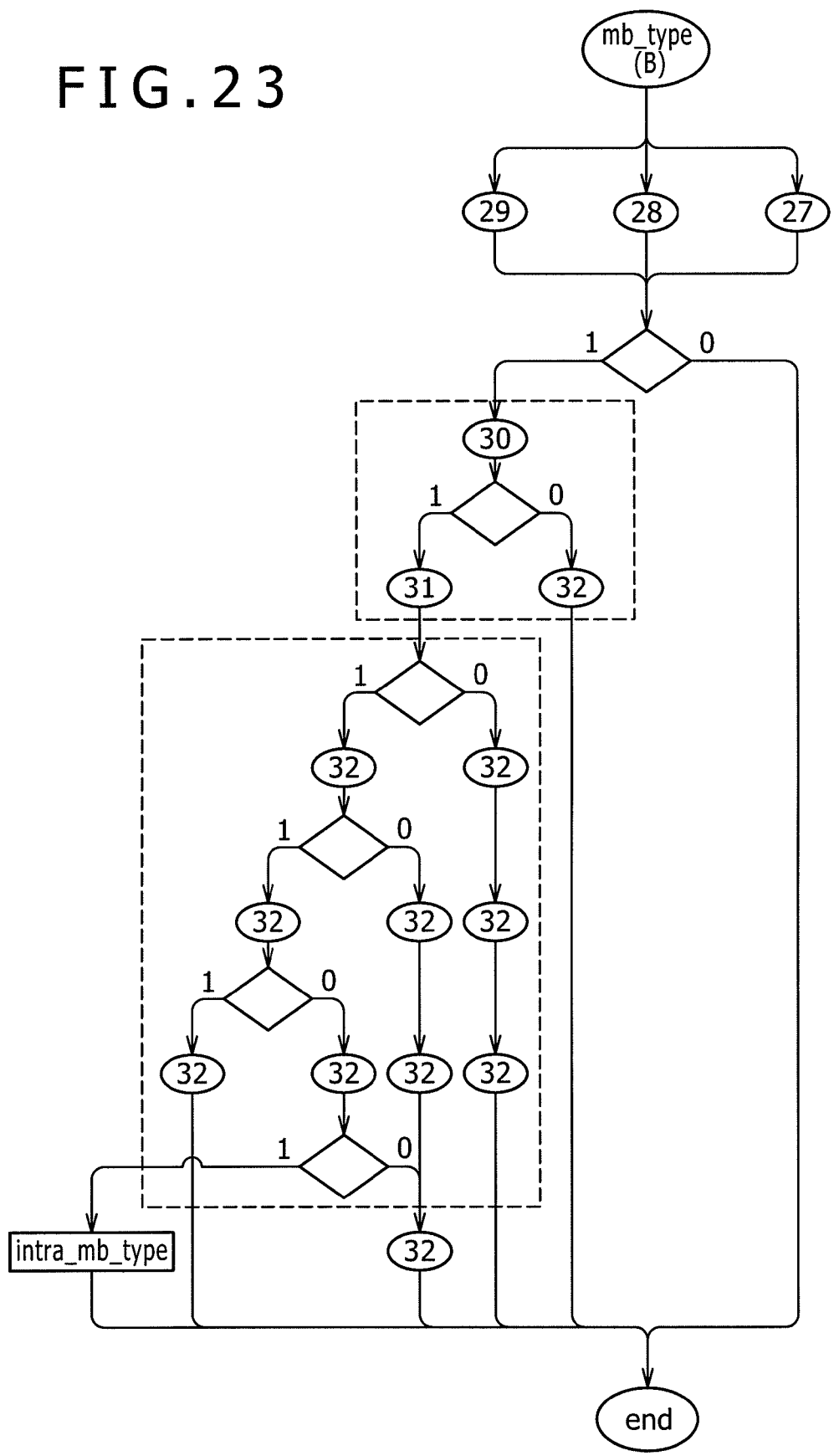
FIG. 23 is a state-transition diagram showing state transitions which occur in CABAC decoding processing to generate a syntax element of a B-slice macroblock type.
Figure 24:
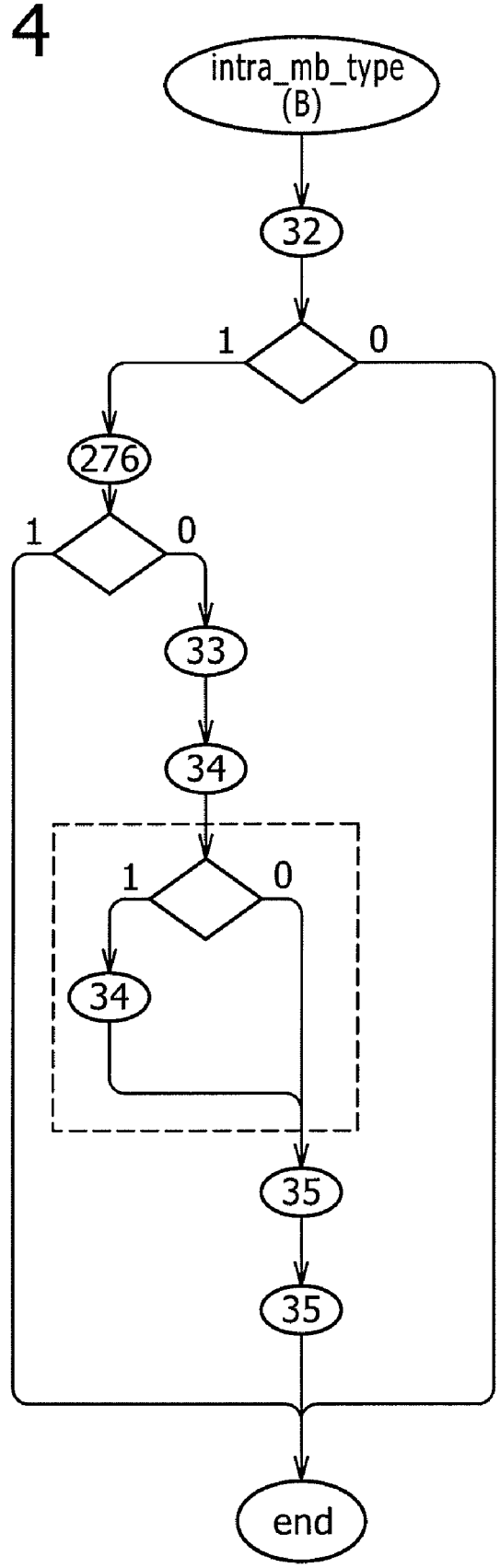
FIG. 24 is a state-transition diagram showing state transitions which occur in CABAC decoding processing to generate a syntax element inside a macroblock of a B-slice macroblock type.

FIGS. 23 and 24 are each a state-transition diagram showing state transitions which occur in CABAC decoding processing to generate a syntax element of a B-slice macroblock type. In the case of the CABAC decoding processing to generate a syntax element of a B-slice macroblock type, a context variable identified by a context index of 27, 28 or 29 is initially used to identify a context variable for generating a Bin-data bit as a result of the first Bin decoding process. Then, the result of the first Bin decoding process is used in a conditional branch instruction following the first Bin decoding process to determine a state transition from a state in which the branch instruction is executed to the next state.

FIG. 25 shows a typical program composed of instructions pertaining to an instruction set according to the embodiment of the present invention to serve as a program to be executed for carrying out CABAC decoding processing to generate a syntax element of a B-slice macroblock type.

The load instruction on line 1 of the program shown in FIG. 25 is executed in order to load context variables from the memory 110 to the context-variable register 330. The Bin decoding instruction on line 2 of the program is executed in order to carry out a Bin decoding process by making use of a context variable identified by a context index of 27, 28 or 29 so as to generate a Bin-data bit. Since the CLR operand value is specified in the Bin decoding instruction on line 2, data stored in the Bin buffer 340 and the contents of the Bin counter 350 are cleared prior to the execution of the Bin decoding instruction. The Bin-data bit obtained as a result of the Bin decoding process is stored in the CCR (Condition Code Register) bit indicated by the cc0 operand value specified in the Bin decoding instruction. In conjunction with the cidx operand value of 0, the gpr1 operand value of the rs operand specifies a value of the context index to be used for identifying one of the context variables which have been stored in the context-variable register 330. To put it in detail, the gpr1 operand value identifies a specific general purpose register, the contents of which are to be added to the cidx operand value of 0 to produce a sum to be used as a context index for identifying one of the context variables. In this case, it is assumed that a value of 27, 28 or 29 has been stored in advance in the specific general purpose register.

The conditional branch instruction on line 3 of the program is executed in order to make a jump to the store instruction on line 23 of the program if the Bin-data bit obtained as a result of the Bin decoding process carried out by the Bin decoding instruction on line 2 is 0. If the Bin-data bit obtained as a result of the Bin decoding process carried out by the Bin decoding instruction on line 2 is 1, on the other hand, the flow of the program goes on from the conditional branch instruction on line 3 to the instruction on Bin decoding line 4.

The Bin decoding instruction on line 4 of the program shown in FIG. 25 is executed in order to carry out a Bin decoding process by making use of a context variable identified by a context index of 30 (cidx=3 and rs=0) so as to generate a Bin-data bit. The Bin-data bit obtained as a result of the Bin decoding process is stored in the CCR (Condition Code Register) bit indicated by the cc1 operand value specified in the Bin decoding instruction.

The Bin decoding instruction on line 5 of the program shown in FIG. 25 is executed in order to carry out a Bin decoding process by making use of a context variable identified by a context index of 31 or 32 (cidx=4, rs=0 and CINC0) so as to generate a Bin-data bit. The Bin decoding instruction on line 5 of the program makes use of a conditional incrementing function by specifying the CINC0 operand value which means that this Bin decoding process is carried out in accordance with the Bin-data bit obtained as a result of the Bin decoding process carried out by execution of the immediately preceding Bin decoding instruction. To be more specific, this Bin decoding process is carried out by making use of a context variable identified by a context index of 31 (=cidx+GPR [0]) if the Bin-data bit obtained as a result of the Bin decoding process carried out by execution of the immediately preceding Bin decoding instruction is 1 or making use of a context variable identified by a context index of 32 (=cidx+GPR [0]+1) obtained as a result of incrementing (cidx+GPR [0]) by 1 if the Bin-data bit obtained as a result of the immediately preceding decoding process is 0.

The conditional branch instruction on line 6 of the program shown in FIG. 25 is executed in order to make a jump to the store instruction on line 23 of the program if the CCR (Condition Code Register) bit specified by the cc1 operand value is 0. As described above, the CCR bit specified by the cc1 operand value should have been used for storing the Bin-data bit obtained as a result of the Bin decoding process carried out by the Bin decoding instruction on line 4. If the CCR bit specified by the cc1 operand value is 1, on the other hand, the flow of the program goes on from the conditional branch instruction on line 6 to the Bin decoding instruction on line 7.

The Bin decoding instruction on each of lines 7 to 9 of the program shown in FIG. 25 is executed in order to carry out a Bin decoding process by making use of a context variable identified by a context index of 32 (cidx=5 and rs=0) so as to generate a Bin-data bit. That is to say, this Bin decoding process is carried out three times in a row in order to generate three consecutive Bin-data bits.

The Bin matching instruction on line 10 of the program shown in FIG. 25 is executed in order to store 1 in the CCR (Condition Code Register) bit specified by the cc2 operand value if the fourth, third and second most recent Bin-data bits each obtained as a result of a previous decoding process are all 1 or the fourth most recent Bin-data bit obtained as a result of a previous decoding process is 0. If the fourth, third and second most recent Bin-data bits each obtained as a result of a previous decoding process are not all 1 and the fourth most recent Bin-data bit obtained as a result of a previous decoding process is not 0, on the other hand, the Bin matching instruction on line 10 is executed in order to store 0 in the CCR bit specified by the cc2 operand value.

The Bin matching instruction on line 11 of the program shown in FIG. 25 is executed in order to store 1 in the CCR (Condition Code Register) bit specified by the cc3 operand value if the fourth, third and first most recent Bin-data bits each obtained as a result of a previous decoding process are all 1 and the second most recent Bin-data bit obtained as a result of the previous decoding process is 0. If the fourth, third and first most recent Bin-data bits each obtained as a result of a previous decoding process are not all 1 or the second most recent Bin-data bit obtained as a result of the previous decoding process is not 0, on the other hand, the Bin matching instruction on line 11 is executed in order to store 0 in the CCR bit specified by the cc3 operand value.

The conditional branch instruction on line 12 of the program shown in FIG. 25 is executed in order to make a jump to the store instruction on line 23 of the program if the CCR (Condition Code Register) bit specified by the cc2 operand value is 1. As described above, the CCR bit specified by the cc2 operand value should have been used for storing a result of the matching process carried out by the Bin matching instruction on line 10.

The Bin decoding instruction on line 13 of the program shown in FIG. 25 is executed in order to carry out a Bin decoding process by making use of a context variable identified by a context index of 32 (cidx=5 and rs=0) so as to generate a Bin-data bit. The Bin-data bit obtained as a result of the Bin decoding process is stored in the CCR (Condition Code Register) bit indicated by the cc4 operand value specified in the Bin decoding instruction.

The conditional branch instruction on line 14 of the program shown in FIG. 25 is executed in order to make a jump to the store instruction on line 23 of the program if the CCR (Condition Code Register) bit specified by the cc3 operand value is 0. As described above, the CCR bit specified by the cc3 operand value should have been used for storing a result of the matching process carried out by the Bin matching instruction on line 11.

The conditional branch instruction on line 15 of the program shown in FIG. 25 is executed in order to make a jump to the store instruction on line 23 of the program if the CCR (Condition Code Register) bit specified by the cc4 operand value is 0. As described above, the CCR bit specified by the cc4 operand value should have been used for storing the Bin-data bit obtained as a result of the Bin decoding process carried out by the Bin decoding instruction on line 13.

The Bin decoding instruction on line 16 of the program shown in FIG. 25 is executed in order to carry out a Bin decoding process by making use of a context variable identified by a context index of 276 so as to generate a Bin-data bit. The Bin-data bit obtained as a result of the Bin decoding process is stored in the CCR (Condition Code Register) bit indicated by the cc5 operand value specified in the Bin decoding instruction.

The Bin decoding instruction on line 17 of the program shown in FIG. 25 is executed in order to carry out a Bin decoding process by making use of a context variable identified by a context index of 33 (cidx=6 and rs=0) so as to generate a Bin-data bit. The Bin decoding instruction on line 17 of the program makes use of the conditional execution function by specifying the CEX0 operand value which means that this Bin decoding process is carried out only if the Bin-data bit obtained as a result of the Bin decoding process carried out by execution of the immediately preceding Bin decoding instruction is 0.

The conditional branch instruction on line 18 of the program shown in FIG. 25 is executed in order to make a jump to the store instruction on line 23 of the program if the CCR (Condition Code Register) bit specified by the cc5 operand value is 0. As described above, the CCR bit specified by the cc5 operand value should have been used for storing the Bin-data bit obtained as a result of the Bin decoding process carried out by the Bin decoding instruction on line 16.

The Bin decoding instruction on line 19 of the program shown in FIG. 25 is executed in order to carry out a Bin decoding process by making use of a context variable identified by a context index of 34 (cidx=7 and rs=0) so as to generate a Bin-data bit.

The Bin decoding instruction on line 20 of the program shown in FIG. 25 is executed in order to carry out a Bin decoding process by making use of a context variable identified by a context index of 34 (cidx=7 and rs=0) so as to generate a Bin-data bit. The Bin decoding instruction on line 20 of the program makes use of the conditional execution function by specifying the CEX1 operand value which means that this Bin decoding process is carried out only if the Bin-data bit obtained as a result of the Bin decoding process carried out by execution of the immediately preceding Bin decoding instruction is 1.

The Bin decoding instruction on each of lines 21 to 22 of the program shown in FIG. 25 is executed in order to carry out a Bin decoding process by making use of a context variable identified by a context index of 35 (cidx=8 and rs=0) so as to generate a Bin-data bit. That is to say, this Bin decoding process is carried out twice in a row in order to generate two successive Bin-data bits.

The store instruction on line 23 of the program shown in FIG. 25 is executed in order to store the context variables held in the context-variable register 330 in the memory 110. Then, the multi-value conversion instruction on line 24 of the program is executed in order to carry out a multi-value conversion process on the Bin-data bits each obtained as a result of one of the Bin decoding processes which have been carried out so far. Finally, the unconditional branch instruction on line 25 of the program is executed in order to make a jump to a return address.

Figure 26:
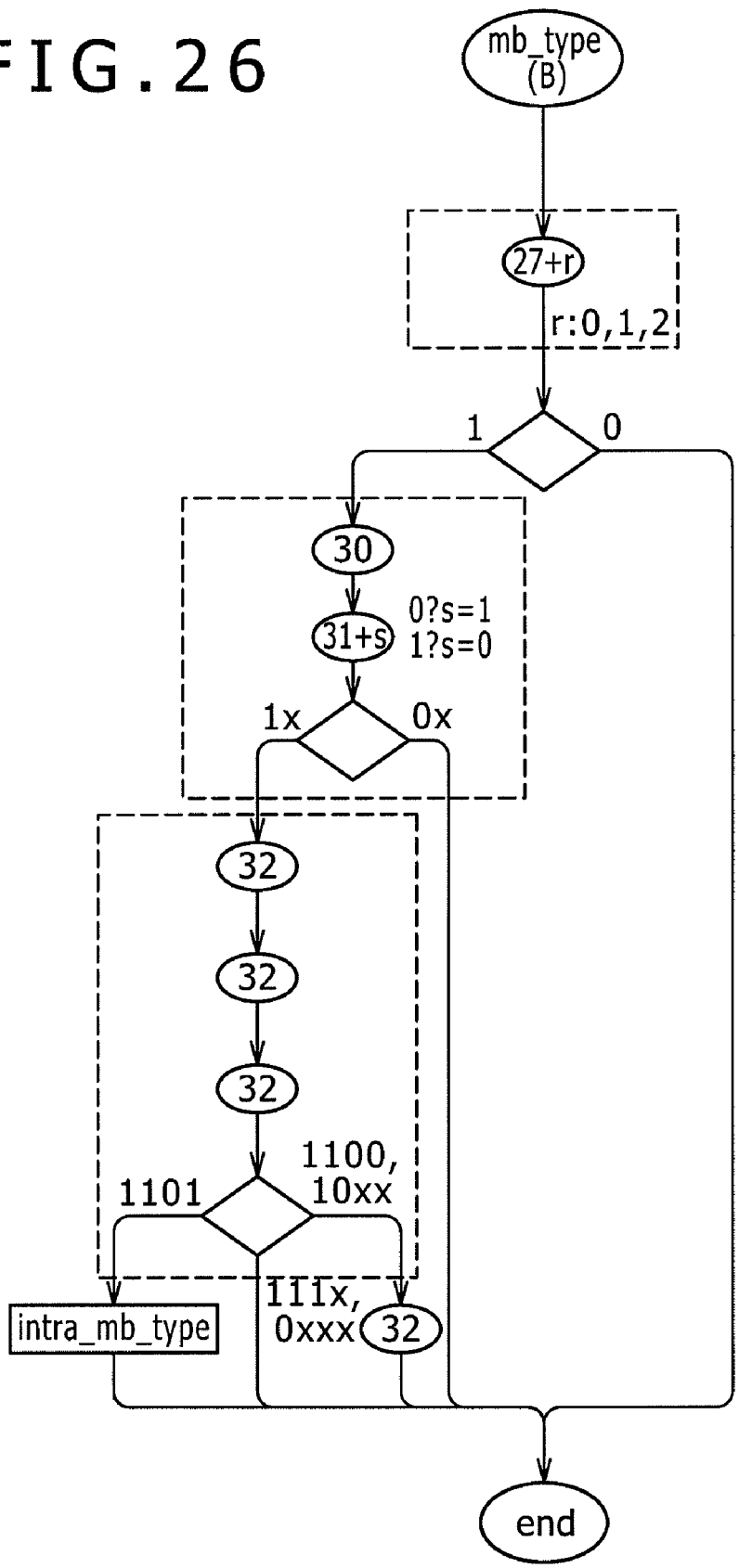
FIG. 26 is a state-transition diagram showing state transitions which occur in CABAC decoding processing to generate a syntax element of a B-slice macroblock type in accordance with the typical program shown in FIG. 25.
Figure 27:
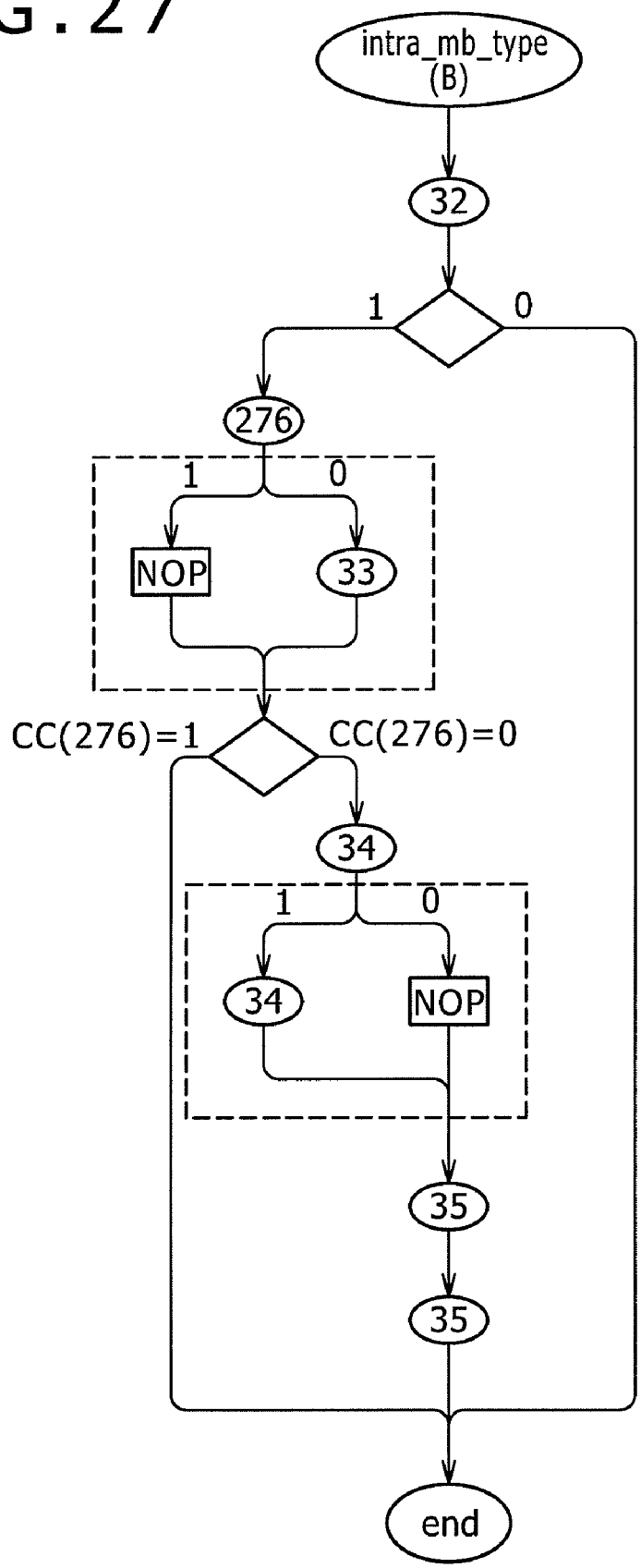
FIG. 27 is a state-transition diagram showing state transitions which occur in CABAC decoding processing to generate a syntax element inside a macroblock of a B-slice macroblock type in accordance with the typical program shown in FIG. 25.

FIGS. 26 and 27 are each a state-transition diagram showing state transitions which occur in CABAC decoding processing to generate a syntax element of a B-slice macroblock type in accordance with the typical program shown in FIG. 25.

As described above, the Bin decoding instruction on line 2 of the program shown in FIG. 25 is executed in order to carry out a Bin decoding process by making use of a context variable identified by the initial context index of 27, 28 or 29 so as to generate a Bin-data bit. In order to carry out this Bin decoding process by making use of a Bin decoding instruction on one line, that is, line 2, one of the initial context indexes of 27, 28 and 29 has been stored in a general purpose register specified in the Bin decoding instruction.

The Bin decoding instruction on line 2 of the program shown in FIG. 25 is executed in a state which is represented by an ordinary node with a context number of (27+r) in the state-transition diagram of FIG. 26 where symbol r denotes the value of 0, 1 or 2.

In addition, the Bin decoding instruction on line 5 of the program shown in FIG. 25 is executed in order to carry out a Bin decoding process by making use of a context variable identified by a context index of 31 or 32 so as to generate a Bin-data bit. The Bin decoding instruction on line 5 of the program deliberately makes use of a conditional incrementing function. The use of the conditional incrementing function allows a conditional branch instruction to be eliminated so that a pipeline stall can be avoided.

In addition, processing is carried out by execution of the instructions on lines 5 to 12 of the program in order to generate Bin-data bits for the inside of the macroblock. The processing begins with the Bin decoding instruction on line 5 of the program. As described above, the Bin decoding instruction on line 5 of the program is executed in order to carry out a Bin decoding process by making use of a context variable identified by a context index of 31 or 32 so as to generate one of the Bin-data bits. The processing also includes matching instructions on lines 10 and 11 of the program after the Bin decoding instruction on line 5. Each of the Bin matching instructions is executed in order to compare 4 Bin-data bits each obtained as a result of a Bin decoding process carried out previously with operands specified in the instruction. The use of the Bin matching instructions thus allows conditional branch instructions to be eliminated. As a result, pipeline stalls can be avoided.

In addition, the conditional branch instruction on line 18 of the program shown in FIG. 25 is executed in order to make a jump to the store instruction on line 23 of the program if the CCR (Condition Code Register) bit specified by the cc5 operand value is 1, or the flow of the program goes on from the conditional branch instruction on line 18 to the Bin decoding instruction on line 19. As described above, the CCR bit specified by the cc5 operand value should have been used for storing the Bin-data bit obtained as a result of the Bin decoding process carried out by the Bin decoding instruction on line 16. Thus, the conditional branch instruction on line 18 of the program has to be executed after the Bin-data bit obtained as a result of the Bin decoding process carried out by the Bin decoding instruction on line 16 has been set at the CCR bit. However, it takes time to complete the execution of this Bin decoding instruction. This situation gives rise to a wait time which is the time that it takes to establish the branch condition at the CCR bit. This wait time is the so-called latency of the Bin decoding instruction which establishes the branch condition for the conditional branch instruction on line 18. In order to conceal this latency, the Bin decoding instruction on line 17 of the program is executed between lines 16 and 18 of the program so as to carry out a Bin decoding process by making use of a context variable identified by a context index of 33. In this way, while this Bin decoding process is being carried out, the branch condition is established at the CCR bit.

The Bin decoding instruction on line 16 of the program shown in FIG. 25 is executed in a state which is represented by an ordinary node with a context number of 276 in the state-transition diagram of FIG. 27. The Bin decoding instruction on line 17 of the same program is executed in a state which is represented by a dotted-line block enclosing an ordinary node with a context number of 33 in the same state-transition diagram. The conditional branch instruction on line 18 of the same program is executed in a state which is represented by a branch node with branches denoted by symbols cc(276)=1 and cc(276)=0 in the same state-transition diagram. The Bin decoding instruction on line 19 of the same program is executed in a state which is represented by an upper ordinary node with a context number of 34 in the same state-transition diagram.

In addition, the Bin decoding instruction on line 20 of the program shown in FIG. 25 is executed in order to carry out a Bin decoding process by making use of a context variable identified by a context index of 34 so as to generate a Bin-data bit. The Bin decoding instruction on line 20 of the program deliberately makes use of the conditional execution function. The use of the conditional execution function allows a conditional branch instruction to be eliminated so that a pipeline stall can be avoided.

Other Typical Application to a P-slice Sub-Macroblock Type

Figures 28, 29:
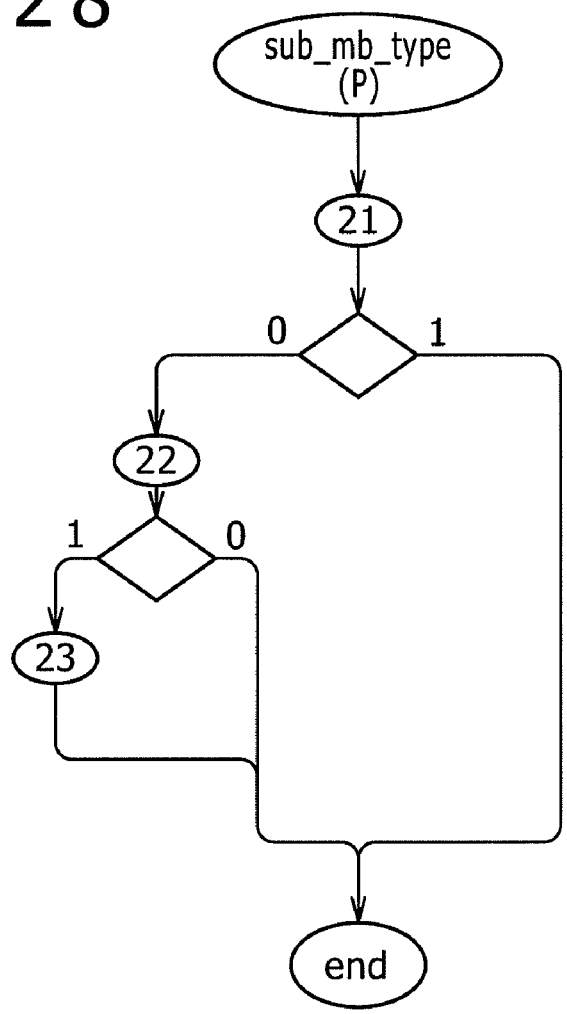
FIG. 28 is a state-transition diagram showing state transitions which occur in CABAC decoding processing to generate a syntax element of a P-slice sub-macroblock type.
FIG. 29 shows a typical program composed of instructions pertaining to an instruction set according to the embodiment of the present invention to serve as a program to be executed for carrying out CABAC decoding processing to generate a syntax element of a P-slice sub-macroblock type.

FIG. 28 is a state-transition diagram showing state transitions which occur in CABAC decoding processing to generate a syntax element of a P-slice sub-macroblock type. As shown in the state-transition diagram of FIG. 28, in the CABAC decoding processing to generate a syntax element of a P-slice sub-macroblock type, a context variable identified by a context index of 21 is used in a first state in which the first Bin decoding process is carried out in order to generate the first Bin-data bit. If the first Bin-data bit obtained as a result of the first Bin decoding process is 1, the CABAC decoding processing is ended right away. If the first Bin-data bit obtained as a result of the first Bin decoding process is 0, on the other hand, a transition to a second state is made. In the second state, a context variable identified by a context index of 22 is used in the second Bin decoding process to generate the second Bin-data bit. If the second Bin-data bit obtained as a result of the second Bin decoding process is 1, a transition is made to a third state in which a context variable identified by a context index of 23 is used in the third Bin decoding process to generate the third Bin-data bit. Upon completion of the third Bin decoding process, the CABAC decoding processing is ended. If the second Bin-data bit obtained as a result of the second Bin decoding process is 0, on the other hand, the CABAC decoding processing is ended right away.

FIG. 29 shows a typical program composed of instructions pertaining to an instruction set according to the embodiment of the present invention to serve as a program to be executed for carrying out CABAC decoding processing to generate a syntax element of a P-slice sub-macroblock type.

The load instruction on line 1 of the program shown in FIG. 29 is executed in order to load context variables from the memory 110 to the context-variable register 330. The Bin decoding instruction on line 2 of the program is executed in order to carry out a Bin decoding process by making use of a context variable identified by a context index of 21 (cidx=7 and rs=0) so as to generate a Bin-data bit. In this Bin decoding instruction, the operand value of 7 is the value of the cidx operand. On the other hand, the zero operand value specified in this Bin decoding instruction is equivalent to the statement rs=0 which means that the value of the rs operand is set at 0.

In addition, the contents of the general purpose register GPR [rs (=0)] are assumed to have been set at 14. That is to say, the context index of 21 is the sum of cidx (=7) and GPR [rs] (=14). The Bin-data bit obtained as a result of the Bin decoding process is stored in the CCR (Condition Code Register) bit indicated by the cc0 operand value specified in the Bin decoding instruction. In addition, since the CLR operand value is specified in the Bin decoding instruction, data stored in the Bin buffer 340 and the contents of the Bin counter 350 are cleared prior to the execution of the Bin decoding instruction.

The Bin decoding instruction on line 3 of the program shown in FIG. 29 is executed in order to carry out a Bin decoding process by making use of a context variable identified by a context index of 22 (cidx=8 and rs=0) so as to generate a Bin-data bit. The CEX0 operand value specified in the Bin decoding instruction means that the Bin decoding process is carried out only if the Bin-data bit obtained as a result of the Bin decoding process carried out by execution of the immediately preceding Bin decoding instruction is 0.

The conditional branch instruction on line 4 of the program shown in FIG. 29 is executed in order to make a jump to the store instruction on line 6 of the program if the CCR (Condition Code Register) bit specified by the cc0 operand value is 1. As described above, the CCR bit specified by the cc0 operand value should have been used for storing the Bin-data bit obtained as a result of the Bin decoding process carried out by the Bin decoding instruction on line 2.

The Bin decoding instruction on line 5 of the program shown in FIG. 29 is executed in order to carry out a Bin decoding process by making use of a context variable identified by a context index of 23 (cidx=9 and rs=0) so as to generate a Bin-data bit. The CEX1 operand value specified in the Bin decoding instruction means that the Bin decoding process is carried out only if the Bin-data bit obtained as a result of the Bin decoding process carried out by execution of the immediately preceding Bin decoding instruction is 1.

The store instruction on line 6 of the program shown in FIG. 29 is executed in order to store the context variables held in the context-variable register 330 in the memory 110. Then, the multi-value conversion instruction on line 7 of the program is executed in order to carry out a multi-value conversion process on the Bin-data bits each obtained as a result of one of the Bin decoding processes which have been carried out so far. Finally, the unconditional branch instruction on line 8 of the program is executed in order to make a jump to a return address.

Figure 30:
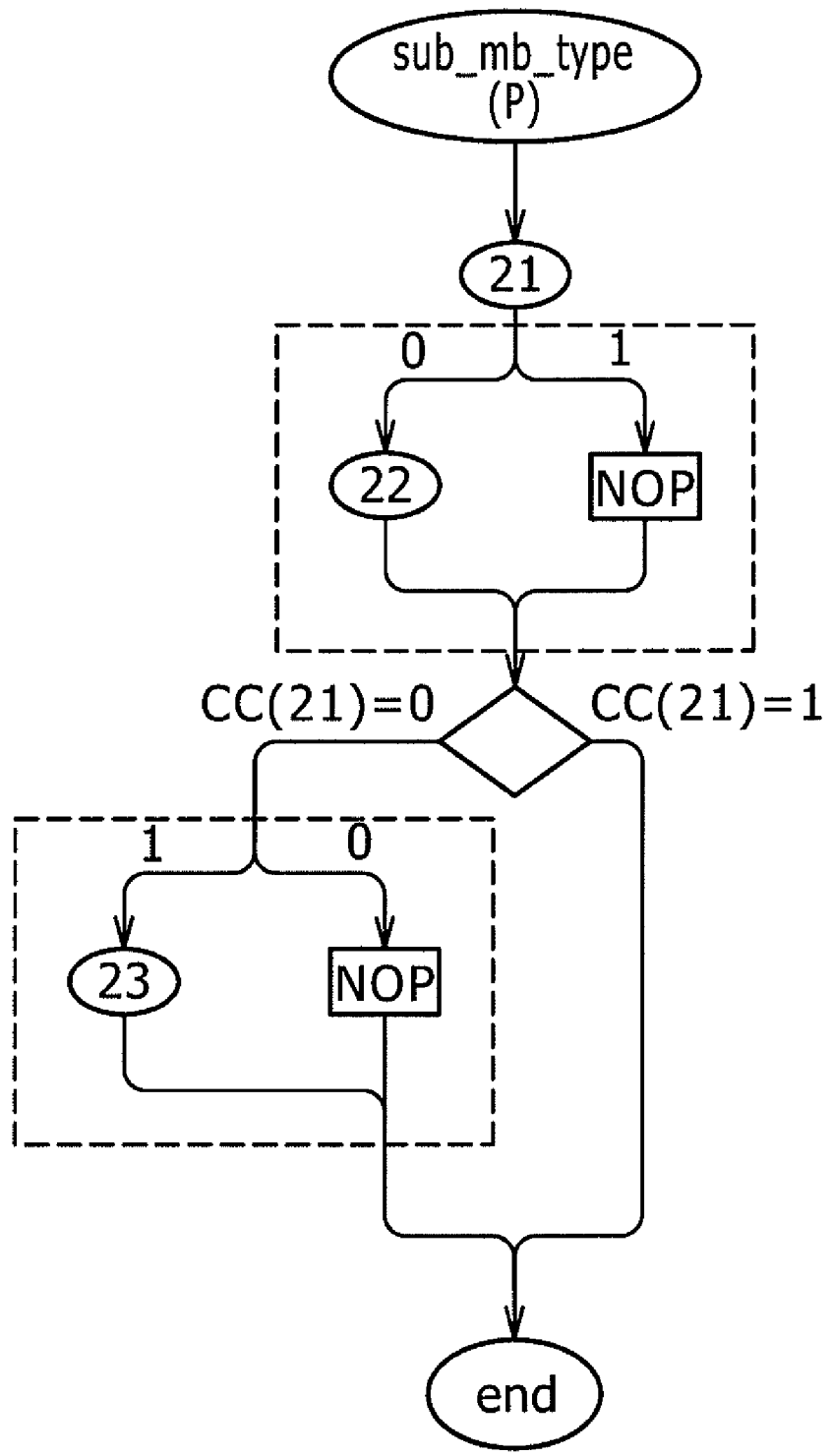
FIG. 30 is a state-transition diagram showing state transitions which occur in CABAC decoding processing to generate a syntax element of a P-slice sub-macroblock type in accordance with the typical program shown in FIG. 29.

FIG. 30 is a state-transition diagram showing state transitions which occur in CABAC decoding processing to generate a syntax element of a P-slice sub-macroblock type in accordance with the typical program shown in FIG. 29.

The conditional branch instruction on line 4 of the program shown in FIG. 29 is executed in order to make a jump to the store instruction on line 6 of the program if the CCR (Condition Code Register) bit specified by the cc0 operand value is 1, or the flow of the program goes on from the conditional branch instruction on line 4 to the Bin decoding instruction on line 5 if the CCR bit specified by the cc0 operand value is 0. As described above, the CCR bit specified by the cc0 operand value should have been used for storing the Bin-data bit obtained as a result of the Bin decoding process carried out by the Bin decoding instruction on line 2. Thus, the conditional branch instruction on line 4 of the program has to be executed after the Bin-data bit obtained as a result of the Bin decoding process carried out by the Bin decoding instruction on line 2 has been set at the CCR bit. However, it takes time to complete the execution of this Bin decoding instruction. This situation gives rise to a wait time which is the time that it takes to establish the branch condition at the CCR bit. This wait time is the so-called latency of the Bin decoding instruction which establishes the branch condition for the conditional branch instruction on line 4. In order to conceal this latency, the Bin decoding instruction on line 3 of the program is executed between lines 2 and 4 of the program so as to carry out a Bin decoding process by making use of a context variable identified by a context index of 22. In this way, while this Bin decoding process is being carried out, the branch condition is established at the CCR bit.

The Bin decoding instruction on line 2 of the program shown in FIG. 29 is executed in a state which is represented by an ordinary node with a context number of 21 in the state-transition diagram of FIG. 30. The Bin decoding instruction on line 3 of the same program is executed in a state which is represented by a dotted-line block enclosing an ordinary node with a context number of 22 in the same state-transition diagram. The conditional branch instruction on line 4 of the same program is executed in a state which is represented by a branch node with branches denoted by symbols cc(21)=1 and cc(21)=0 in the same state-transition diagram.

In addition, the Bin decoding instruction on line 5 of the program shown in FIG. 29 is executed in order to carry out a Bin decoding process by making use of a context variable identified by a context index of 23 so as to generate a Bin-data bit. The Bin decoding instruction on line 5 of the program deliberately makes use of the conditional execution function. The use of the conditional execution function allows a conditional branch instruction to be eliminated so that a pipeline stall can be avoided.

Other Typical Application to a B-slice Sub-Macroblock Type

Figure 31:
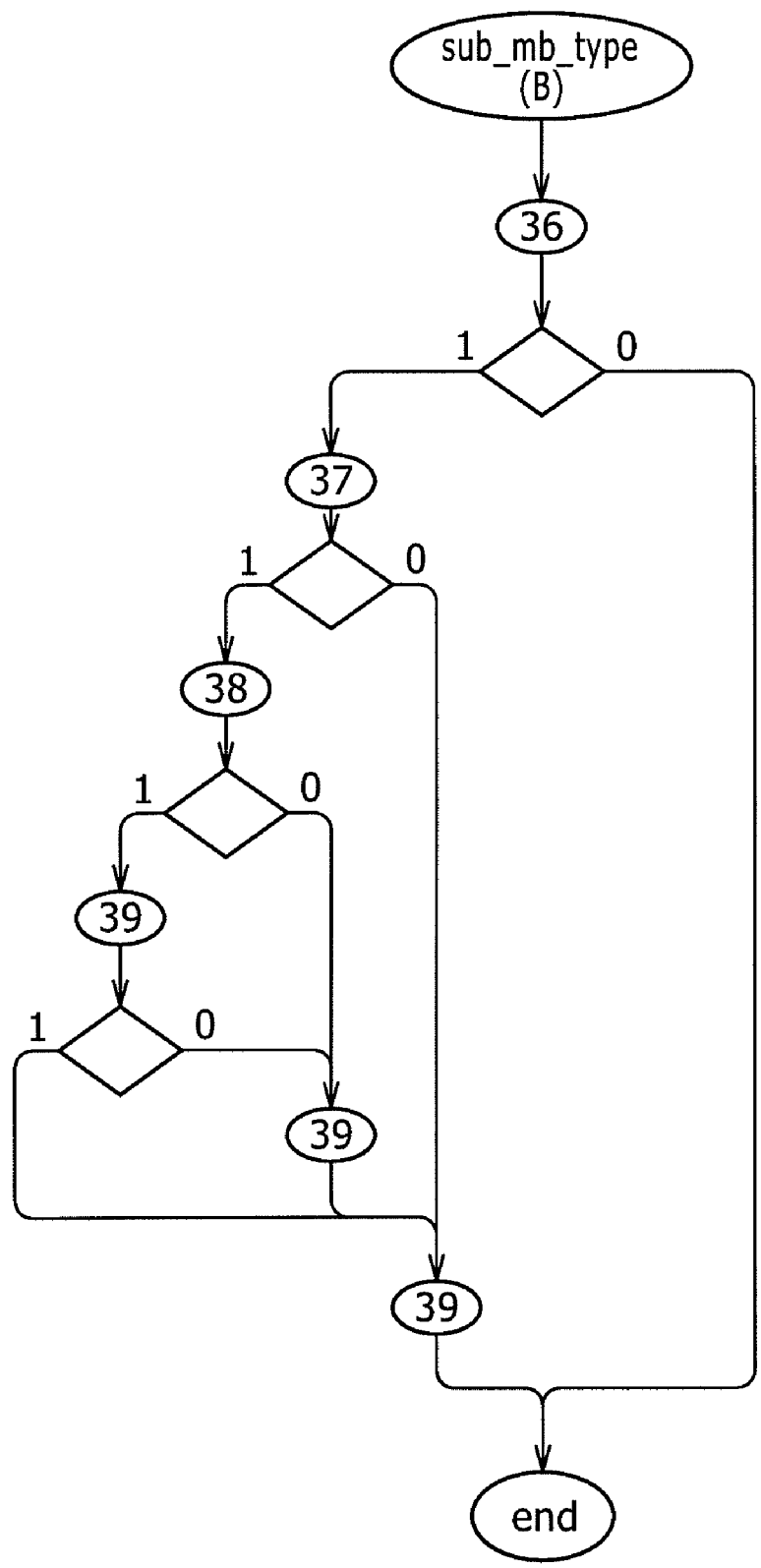
FIG. 31 is a state-transition diagram showing state transitions which occur in CABAC decoding processing to generate a syntax element of a B-slice sub-macroblock type.

FIG. 31 is a state-transition diagram showing state transitions which occur in CABAC decoding processing to generate a syntax element of a B-slice sub-macroblock type. As shown in the state-transition diagram of FIG. 31, in the CABAC decoding processing to generate a syntax element of a B-slice sub-macroblock type, a context variable identified by a context index of 36 is used in a first state in which the first Bin decoding process is carried out in order to generate the first Bin-data bit. If the first Bin-data bit obtained as a result of the first Bin decoding process is 0, the CABAC decoding processing is ended right away. If the first Bin-data bit obtained as a result of the first Bin decoding process is 1, on the other hand, a state transition is made to a second state in which a context variable identified by a context index of 37 is used to carry out the second Bin decoding process in order to generate the second Bin-data bit. Then, a state transition is made to the state of a conditional branch instruction. Subsequently, a next state transition determined in accordance with the second Bin-data bit is made.

FIG. 32 shows a typical program composed of instructions pertaining to an instruction set according to the embodiment of the present invention to serve as a program to be executed for carrying out CABAC decoding processing to generate a syntax element of a B-slice sub-macroblock type.

The load instruction on line 1 of the program shown in FIG. 32 is executed in order to load context variables from the memory 110 to the context-variable register 330. The Bin decoding instruction on line 2 of the program is executed in order to carry out a Bin decoding process by making use of a context variable identified by a context index of 36 (cidx=9 and rs=0) so as to generate a Bin-data bit. In this Bin decoding instruction, the operand value of 9 is the value of the cidx operand. On the other hand, the zero operand value specified in this Bin decoding instruction is equivalent to the statement rs=0 which means that the value of the rs operand is set at 0.

In addition, the contents of the general purpose register GPR [rs (=0)] are assumed to have been set at 27. That is to say, the context index of 36 is the sum of cidx (=9) and GPR [rs] (=27). In addition, since the CLR operand value is specified in the Bin decoding instruction, data stored in the Bin buffer 340 and the contents of the Bin counter 350 are cleared prior to the execution of the Bin decoding instruction. The Bin-data bit obtained as a result of the Bin decoding process is stored in the CCR (Condition Code Register) bit indicated by the cc0 operand value specified in the Bin decoding instruction.

The Bin decoding instruction on line 3 of the program shown in FIG. 32 is executed in order to carry out a Bin decoding process by making use of a context variable identified by a context index of 37 (cidx=10 and rs=0) so as to generate a Bin-data bit. The Bin-data bit obtained as a result of the Bin decoding process is stored in the CCR (Condition Code Register) bit indicated by the cc0 operand value specified in the Bin decoding instruction. The Bin decoding instruction on line 3 of the program makes use of the conditional execution function by specifying the CEX1 operand value which means that this Bin decoding process is carried out only if the Bin-data bit obtained as a result of the Bin decoding process carried out by execution of the immediately preceding Bin decoding instruction is 1.

The Bin decoding instruction on line 4 of the program shown in FIG. 32 is executed in order to carry out a Bin decoding process by making use of a context variable identified by a context index of 38 or 39 (cidx=11, rs=0 and CEX1 as well as CINC0) so as to generate a Bin-data bit. The Bin decoding instruction on line 4 of the program makes use of a conditional incrementing function by specifying the CINC0 operand value which means that this Bin decoding process is carried out in accordance with the Bin-data bit obtained as a result of the Bin decoding process carried out by execution of the immediately preceding Bin decoding instruction. To be more specific, this Bin decoding process is carried out by making use of a context variable identified by a context index of 38 (=cidx+GPR [0]) if the Bin-data bit obtained as a result of the Bin decoding process carried out by execution of the immediately preceding Bin decoding instruction is 1 or making use of a context variable identified by a context index of 39 (=cidx+GPR [0]+1) obtained as a result of incrementing (cidx+GPR [0]) by 1 if the Bin-data bit obtained as a result of the immediately preceding decoding process is 0. The Bin-data bit obtained as a result of the Bin decoding process is stored in the CCR (Condition Code Register) bit indicated by the cc0 operand value specified in the Bin decoding instruction. However, the Bin decoding instruction on line 4 of the program also makes use of the conditional execution function by specifying the CEX1 operand value which means that this Bin decoding process is carried out only if the Bin-data bit obtained as a result of the Bin decoding process carried out by execution of the immediately preceding Bin decoding instruction is 1.

The conditional branch instruction on line 5 of the program shown in FIG. 32 is executed in order to make a jump to the store instruction on line 11 of the program if the CCR (Condition Code Register) bit specified by the cc0 operand value is 0. If the CCR bit specified by the cc0 operand value is 1, on the other hand, the flow of the program goes on from the conditional branch instruction on line 5 to the Bin decoding instruction on line 6. If the Bin-data bit obtained as a result of the execution of the Bin decoding instruction on line 2 of the program has been 0, the Bin decoding instructions on lines 3 and 4 should have not been executed. In this case, the Bin-data bit of 0 obtained as a result of the execution of the Bin decoding instruction on line 2 of the program should have been stored in the CCR bit specified by the cc0 operand value included in the conditional branch instruction on line 5. That is to say, the conditional branch instruction on line 5 of the program is executed in order to make a jump to the store instruction on line 11.

The Bin decoding instruction on each of lines 6 and 7 of the program shown in FIG. 32 is executed in order to carry out a Bin decoding process by making use of a context variable identified by a context index of 39 (cidx=12 and rs=0) so as to generate a Bin-data bit. That is to say, this Bin decoding process is carried out twice in a row in order to generate two consecutive Bin-data bits.

The Bin matching instruction on line 8 of the program shown in FIG. 32 is executed in order to store 1 in the CCR (Condition Code Register) bit indicated by the cc1 operand value specified in the instruction if the third and second most recent Bin-data bits each obtained as a result of a previous decoding process are 1 and 0 respectively. If the third and second most recent Bin-data bits each obtained as a result of a previous decoding process are not 1 and 0 respectively, on the other hand, the Bin matching instruction on line 8 is executed in order to store 0 in the CCR bit indicated by the cc1 operand value.

The conditional branch instruction on line 9 of the program shown in FIG. 32 is executed in order to make a jump to the store instruction on line 11 of the program if the CCR (Condition Code Register) bit specified by the cc1 operand value is 0. As described above, the CCR bit specified by the cc1 operand value should have been used for storing the Bin-data bit obtained as a result of the Bin decoding process carried out by the Bin matching instruction on line 8.

The Bin decoding instruction on line 10 of the program shown in FIG. 32 is executed in order to carry out a Bin decoding process by making use of a context variable identified by a context index of 39 (cidx=12 and rs=0) so as to generate a Bin-data bit.

The store instruction on line 11 of the program shown in FIG. 32 is executed in order to store the context variables held in the context-variable register 330 in the memory 110. Then, the multi-value conversion instruction on line 12 of the program is executed in order to carry out a multi-value conversion process on the Bin-data bits each obtained as a result of one of the Bin decoding processes which have been carried out so far. Finally, the unconditional branch instruction on line 13 of the program is executed in order to make a jump to a return address.

Figure 33:
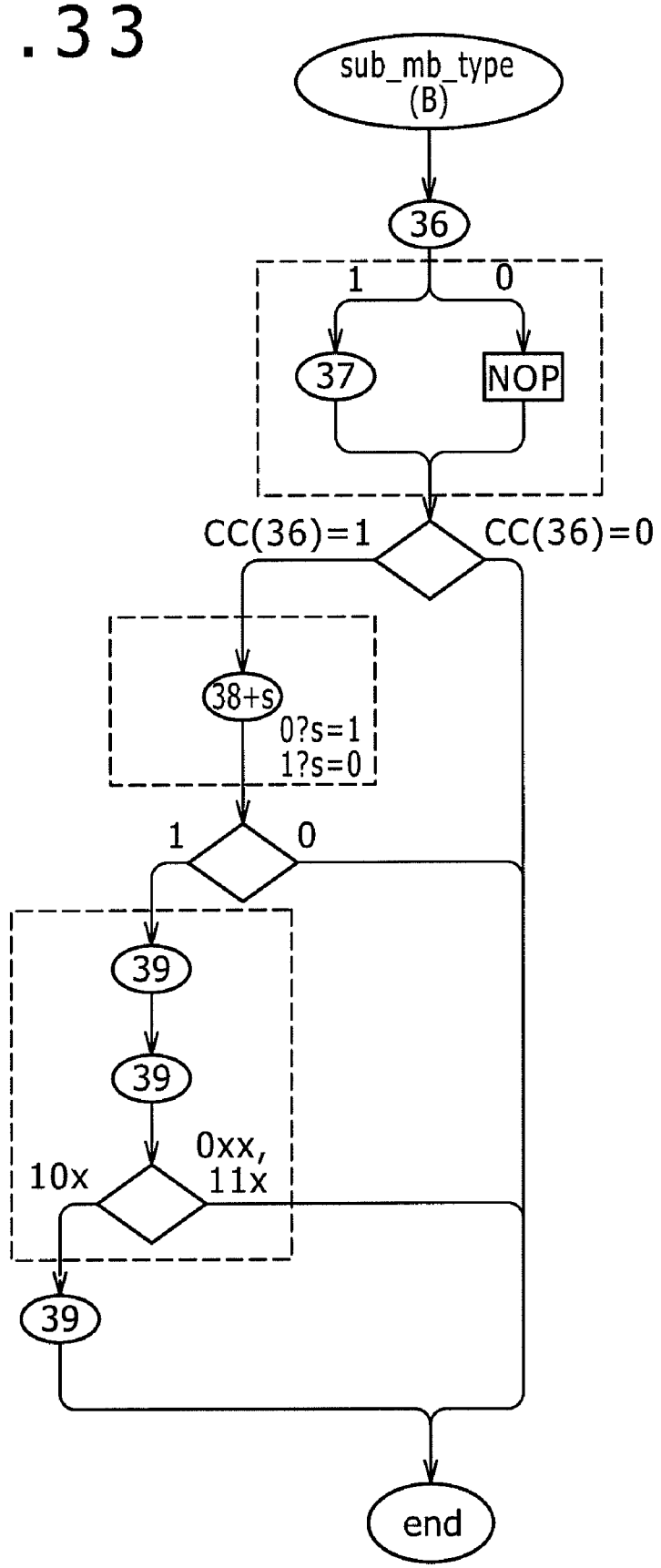
FIG. 33 is a state-transition diagram showing state transitions which occur in CABAC decoding processing to generate a syntax element of a B-slice sub-macroblock type in accordance with the typical program shown in FIG. 32.

FIG. 33 is a state-transition diagram showing state transitions which occur in CABAC decoding processing to generate a syntax element of a B-slice sub-macroblock type in accordance with the typical program shown in FIG. 32.

The conditional branch instruction on line 5 of the program shown in FIG. 32 is executed in order to make a jump to the store instruction on line 11 of the program if the CCR (Condition Code Register) bit specified by the cc0 operand value is 0. As described above, the CCR bit specified by the cc0 operand value should have been used for storing the Bin-data bit obtained as a result of the Bin decoding process carried out by the Bin decoding instruction on line 2. Thus, the conditional branch instruction on line 5 of the program has to be executed after the Bin-data bit obtained as a result of the Bin decoding process carried out by the Bin decoding instruction on line 2 has been set at the CCR bit. However, it takes time to complete the execution of this Bin decoding instruction. This situation gives rise to a wait time which is the time that it takes to establish the branch condition at the CCR bit. This wait time is the so-called latency of the Bin decoding instruction which establishes the branch condition for the conditional branch instruction on line 5. In order to conceal this latency, the Bin decoding instruction on line 3 of the program is executed between lines 2 and 5 of the program so as to carry out a Bin decoding process by making use of a context variable identified by a context index of 37. In this way, while this Bin decoding process is being carried out, the branch condition is established at the CCR bit.

The Bin decoding instruction on line 2 of the program shown in FIG. 32 is executed in a state which is represented by an ordinary node with a context number of 36 in the state-transition diagram of FIG. 33. The Bin decoding instruction on line 3 of the same program is executed in a state which is represented by a dotted-line block enclosing an ordinary node with a context number of 37 in the same state-transition diagram. The conditional branch instruction on line 5 of the same program is executed in a state which is represented by a branch node with branches denoted by symbols cc(36)=1 and cc(36)=0 in the same state-transition diagram.

In addition, the Bin decoding instruction on line 4 of the program shown in FIG. 32 is executed in order to carry out a Bin decoding process by making use of a context variable identified by a context index of 38 or 39 so as to generate a Bin-data bit. The Bin decoding instruction on line 4 of the program deliberately makes use of a conditional incrementing function by specifying the CINC0 operand value which means that this Bin decoding process is carried out in accordance with the Bin-data bit obtained as a result of the Bin decoding process carried out by execution of the immediately preceding Bin decoding instruction. To be more specific, this Bin decoding process is carried out by making use of a context variable identified by a context index of 38 if the Bin-data bit obtained as a result of the Bin decoding process carried out by execution of the immediately preceding Bin decoding instruction is 1 or making use of a context variable identified by a context index of 39 if the Bin-data bit obtained as a result of the immediately preceding decoding process is 0. The use of the conditional incrementing function allows a conditional branch instruction, which would otherwise be included prior to the Bin decoding instruction on line 4, to be eliminated so that a pipeline stall can be avoided.

The Bin decoding instruction on line 4 of the program shown in FIG. 32 is executed in a state which is represented by a dotted-line block enclosing an ordinary node with a context number of (38+s) in the state-transition diagram of FIG. 33 where notation s denotes the value of 0 or 1.

In addition, the Bin decoding instruction on each of lines 6 and 7 of the program shown in FIG. 32 is executed in order to carry out a Bin decoding process by making use of a context variable identified by a context index of 39 so as to generate a Bin-data bit. That is to say, this Bin decoding process is carried out twice in a row in order to generate two successive Bin-data bits. Then, the Bin matching instruction on line 8 is executed in order to store 1 in the CCR (Condition Code Register) bit indicated by the cc1 operand value specified in the instruction if the third and second most recent Bin-data bits each obtained as a result of a previous decoding process are 1 and 0 respectively. If the third and second most recent Bin-data bits each obtained as a result of a previous decoding process are not 1 and 0 respectively, on the other hand, the Bin matching instruction on line 8 is executed in order to store 0 in the CCR bit indicated by the cc1 operand value. In this way, two Bin-data bits are compared with an operand specified in the Bin matching instruction by execution of merely one matching instruction. The use of the Bin matching instruction eliminates branch instructions. As a result, pipeline stalls can be avoided.

The Bin decoding instruction on line 6 of the program shown in FIG. 32 is executed in a state which is represented by an upper ordinary node with a context number of 39 in the state-transition diagram of FIG. 33. The Bin decoding instruction on line 7 of the same program is executed in a state which is represented by a lower ordinary node with a context number of 39 in the same state-transition diagram. The Bin matching instruction on line 8 of the same program and the conditional branch instruction on line 9 of the same program are executed in a state which is represented by a branch node with its branches denoted by symbols 10x as well as 0xx and 11x in the same state-transition diagram.

As described above, in accordance with the embodiment of the present invention, each Bin decoding instruction can be provided with a conditional execution function and/or a conditional incrementing function so that the degree of freedom to arrange instructions can be increased and the latency of an instruction establishing the branch condition for a Bin decoding instruction can be concealed. In addition, by making use of a Bin matching instruction, some conditional branch instructions can be eliminated from a program so that the number of stall cycles of a wait time that may be incurred between interpretation of a conditional branch time and execution of the conditional branch time can be reduced. That is to say, by providing a Bin decoding instruction with a conditional execution function and/or a conditional incrementing function and by making use of Bin matching instructions in accordance with the embodiment of the present invention, the execution efficiency of the pipeline can be increased.

It is to be noted that the embodiment of the present invention is no more than a typical implementation of the present invention. As described above, sections employed in the embodiment correspond to sections described in claims appended to this invention specification. However, implementations of the present invention are by no means limited to the embodiment. That is to say, in order to implement the present invention, it is possible to change the embodiment in a variety of ways within a range that does not deviate from essentials of the present invention.

On top of that, the processing procedure according to the embodiment of the present invention can be interpreted as a method having a procedure to be carried out as a sequence of processes. In this case, the procedure to be carried out as a sequence of processes is implemented by a program to be executed by a computer and the program is stored in advance in a program recording medium. Typical examples of the program recording medium include a CD (Compact Disc), an MD (Mini Disc), a DVD (Digital Versatile Disk), a memory card and a Blu-ray Disc (a trademark).

The present application contains subject matter related to that disclosed in Japanese Priority Patent Application JP 2008-303524 filed in the Japan Patent Office on Nov. 28, 2008, the entire content of which is hereby incorporated by reference.

It should be understood by those skilled in the art that various modifications, combinations, sub-combinations and alterations may occur depending on design requirements and other factor in so far as they are within the scope of the appended claims or the equivalents thereof.

What is claimed is:

1. An arithmetic decoding apparatus comprising:
an instruction decoder configured to decode an arithmetically encoded data decoding instruction to be executed for carrying out an arithmetic-decoding process of arithmetically decoding arithmetically encoded data into a binary signal;
an execution condition code holding section configured to hold said binary signal obtained as a result of an immediately preceding arithmetic-decoding process as an execution condition code; and
an arithmetic decoding execution section configured to
determine whether a context number specified by said arithmetically encoded data decoding instruction is to be used as a context index as it is or said specified context number incremented by 1 is to be used as said context index in accordance with said execution condition code, and
carry out said arithmetic decoding process by making use of said determined context index.

2. The arithmetic decoding apparatus according to claim 1 wherein
said arithmetic decoding execution section determines whether or not said arithmetic-decoding process is to be carried out on the basis of said execution condition code.

3. The arithmetic decoding apparatus according to claim 1 wherein said context number is specified in said arithmetically encoded data decoding instruction as an immediate value to be added to the contents of a register indicated by an input operand also specified in said arithmetic-encoded data decoding instruction.

4. An arithmetic decoding apparatus comprising:
an instruction decoder configured to decode
an arithmetically encoded data decoding instruction for carrying out an arithmetic-decoding process of arithmetically decoding arithmetically encoded data into a binary signal,
a matching instruction having a bit map, which represents a matching condition of said arithmetic-decoding process, as an input operand, and
a branch instruction for making an instruction jump in accordance with a branch condition code;
an arithmetic-decoding execution section configured to carry out said arithmetic-decoding process by making use of a context number specified by said arithmetically encoded data decoding instruction;
a history holding section configured to be used to store a history of said binary signals each obtained as a result of said arithmetic-decoding process;
a matching process section configured to set said branch condition code in accordance with whether or not said history of said binary signal matches said matching condition; and
an instruction control section configured to make said instruction jump in accordance with said branch condition code.

5. The arithmetic decoding apparatus according to claim 4 wherein, if an input operand of said arithmetically encoded data decoding instruction specifies an operation to clear said history held by said history holding section, said arithmetic-decoding execution section clears said history.

* * * * *